United States Patent
Kuhara et al.

(10) Patent No.: US 6,518,638 B1
(45) Date of Patent: Feb. 11, 2003

(54) PHOTODIODE

(75) Inventors: Yoshiki Kuhara, Osaka (JP); Naoyuki Yamabayashi, Osaka (JP); Yasuhiro Iguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/566,982

(22) Filed: May 9, 2000

(30) Foreign Application Priority Data

Jul. 15, 1999 (JP) .......................... 11-201519
Sep. 14, 1999 (JP) .......................... 11-260016

(51) Int. Cl.[7] .............................................. H01L 33/01
(52) U.S. Cl. ...................................... 257/431; 257/461
(58) Field of Search ................... 257/447, 438, 257/431, 199, 448, 457, 459, 460, 461; 358/88

(56) References Cited

U.S. PATENT DOCUMENTS 5,316,956 A * 5/1994 Iwasaki et al. ............ 257/190
6,326,650 B1 * 12/2001 Allam ........................ 257/18

FOREIGN PATENT DOCUMENTS

EP  0 901 170    3/2000
JP  11-83619     3/1999

* cited by examiner

Primary Examiner—Nathan J. Flynn
Assistant Examiner—Leonardo Andujar
(74) Attorney, Agent, or Firm—Smith, Gambrell & Russell, LLP

(57) ABSTRACT

A photodiode (A) comprises a substrate, a light receiving layer having a band gap wavelength and including a pn-junction and at least an absorption layer having a band gap wavelength $\lambda g$. One of the absorption layers is sandwiched between the substrate and the light receiving layer, the band gap wavelength $\lambda g$ of the absorption layer is shorter than the receiving signal wavelength $\lambda_2$ but longer than noise wavelength $\lambda_1 (\lambda_1 < \lambda g < \lambda_2)$. Otherwise a photodiode (B) has two absorption layers epitaxially made on the substrate. One absorption layer is formed on the top surface of the substrate. The other absorption layer is formed on the bottom surface of the substrate. The absorption layers annihilate the noise $\lambda_1$. The PD has no sensitivity to $\lambda_1$.

9 Claims, 17 Drawing Sheets multiwavelength bidirectional optical communication system multiwavelength unidirectional optical communication system Sensitivity distribution of the prior InGaAs-type PD Fig.12 Embodiment 1
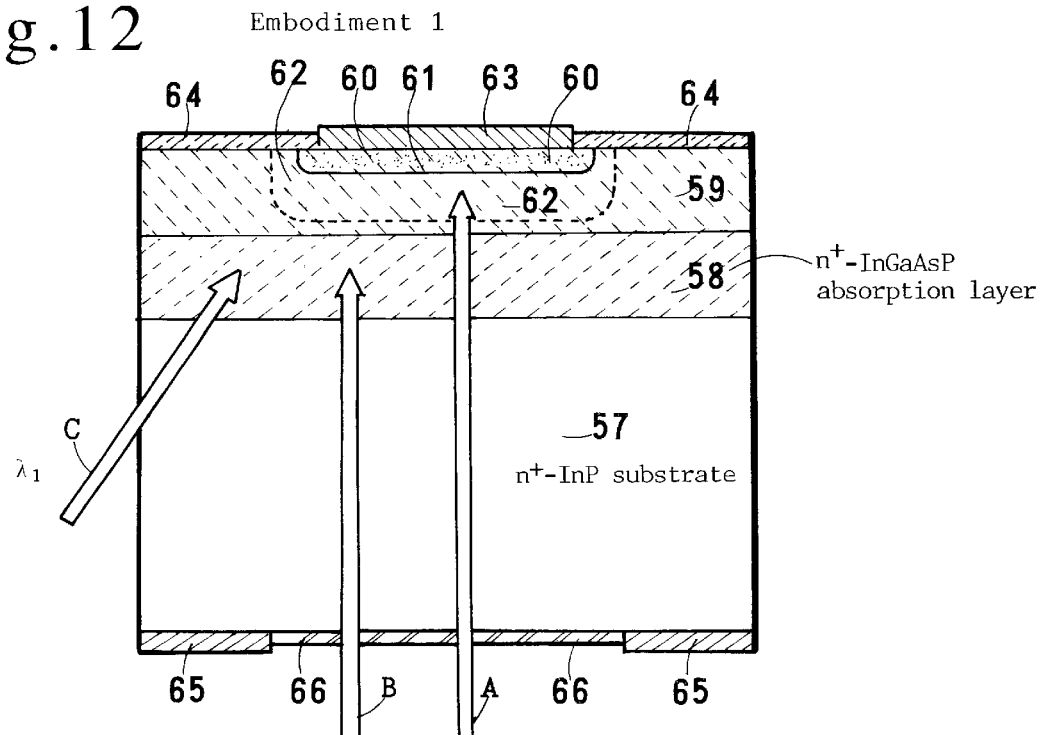
Fig.13 Embodiment 2
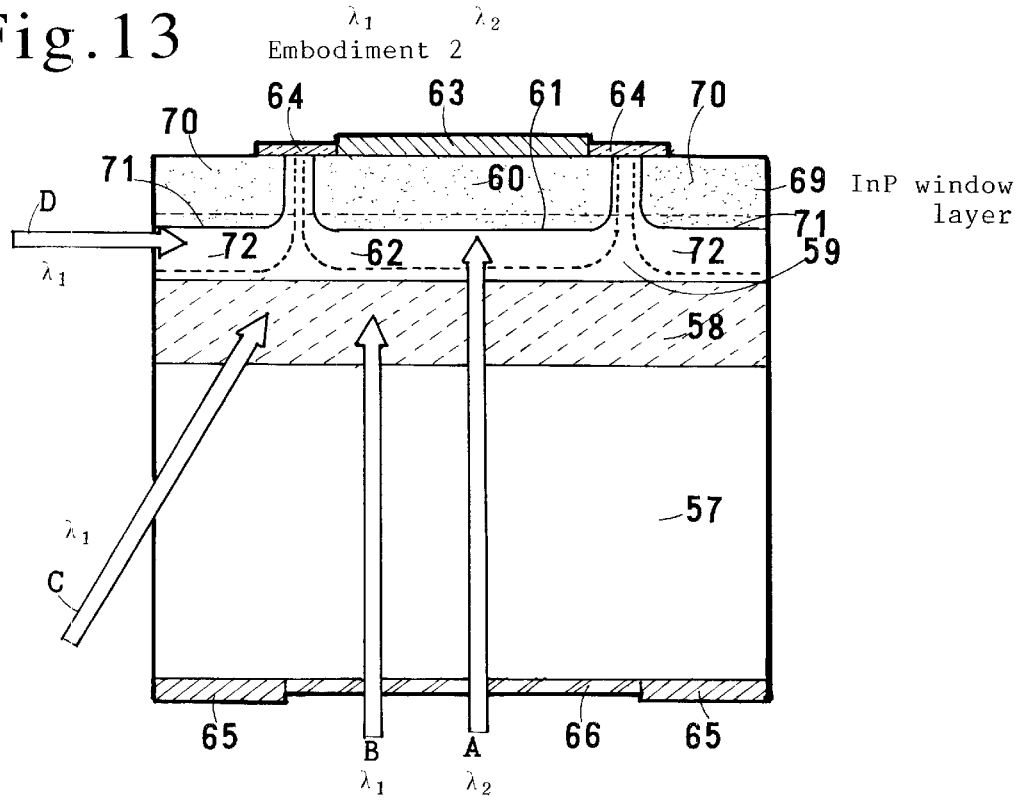

Embodiment 5

Embodiment 6

Embodiment 9

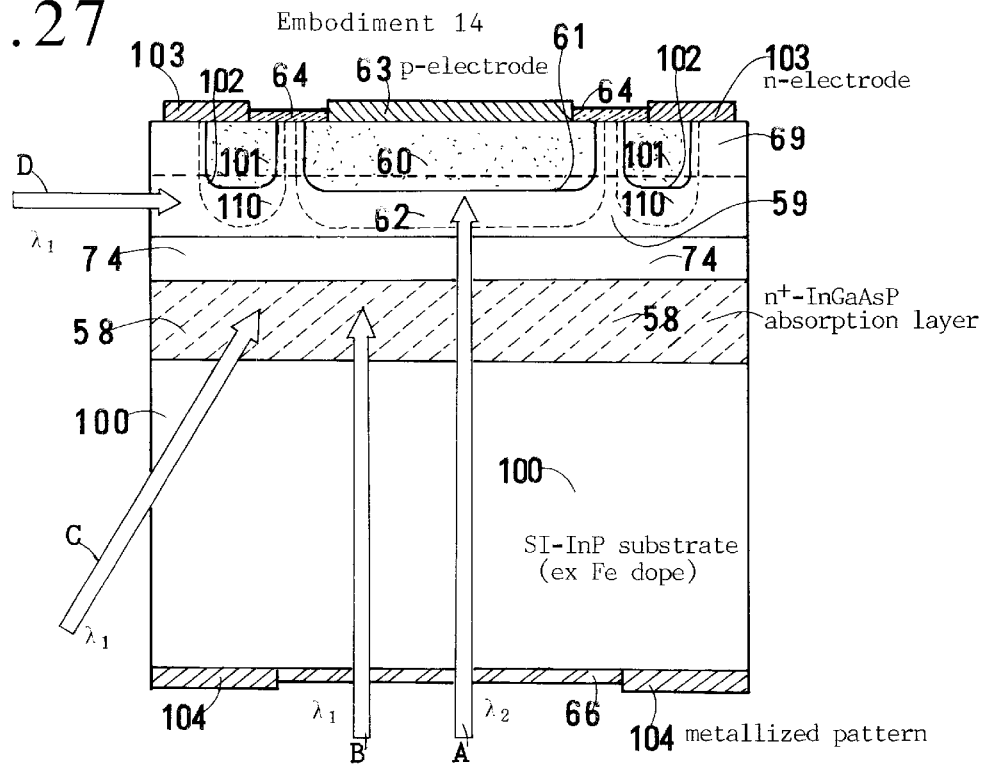
Fig.27 Embodiment 14
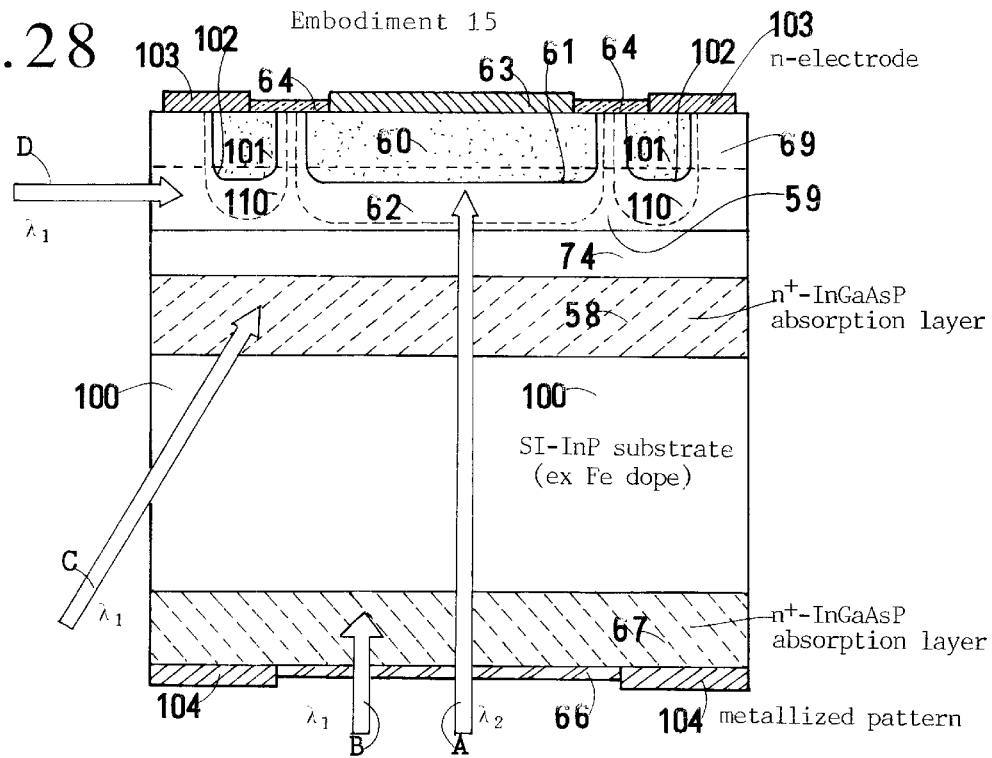
Fig.28 Embodiment 15

Fig.29  Embodiment 16
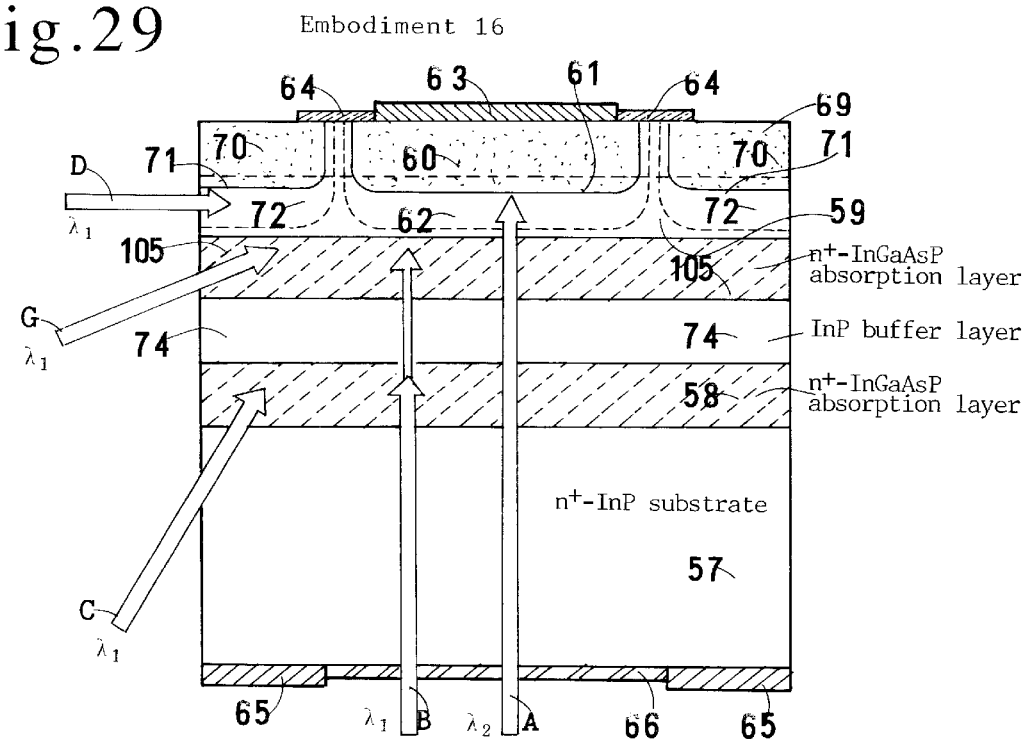
Fig.30  Embodiment 17
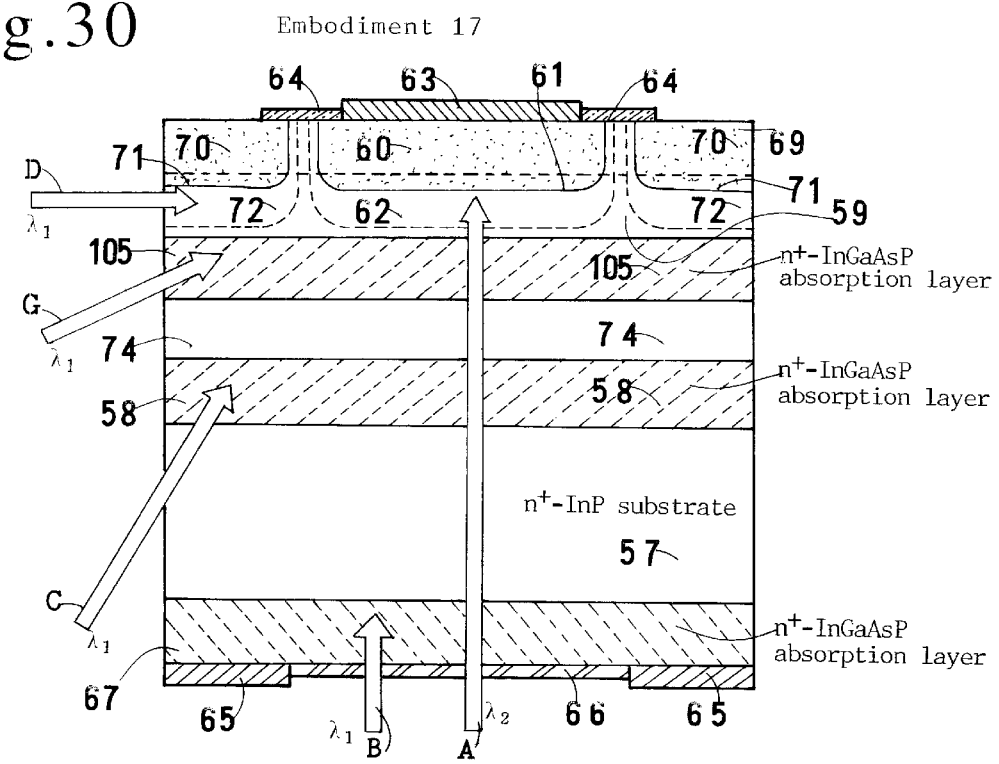

US 6,518,638 B1

PHOTODIODE

BACKGROUND OF THE INVENTION

1. Field of the Invention

This invention relates to a photodiode for an LD/PD module for bidirectional optical communication system with signal light of two wavelengths $\lambda_1$ and $\lambda_2$ via a single optical fiber which can suppress the influence of transmitting light upon the photodiode. The single-fiber bidirectional optical communication system using of a single fiber both for transmitting and receiving signals employs an LD/PD module. The LD/PD module has a substrate, a package, an LD emitting transmission signals and a PD receiving signals mounted upon the common substrate in the common package. This is called a multiwavelength bidirectional LD/PD module.

Another optical communication system transmits more than one signal by the light of plural wavelengths in one direction via a single fiber and receives the multiwavelength signals by a PD module having a plurality of photodiodes. The PD module has more than one photodiode on a common substrate in a common package. This is a unidirectional multiwavelength PD module.

A photodiode is a sensor which converts light power (light signals) to a photocurrent (electric signals) in proportion to the light power. The PD is sometimes called an O/E transducer or O/E sensor. The photodiode is a highly sensitive sensor. The LD generates strong light power for transmitting optical signals to a far distanced port. Although the wavelengths are different for transmitting signals and for receiving signals, the photodiode which has sensitivity also to the transmission wavelength has a possibility of sensing the transmission power yielded by the laser diode mounted on the same package.

This application claims the priority of Japanese Patent Applications No.11-201519 (201519/1999) filed on Jul. 15, 1999 and No.11-260016 (260016/1999) filed on Sep. 14, 1999 which are incorporated herein by reference.

The phenomenon that the PD senses the transmission signal emitted from the LD which is stored in the same package is called "optical crosstalk". The LD light of the same port is noise for the PD. Sensing the transmission light at the same port hinders the PD receiving the transmission light from the counterpart port (e.g., central station). It is important to suppress the crosstalk from the LD (transmitting device) to the PD (receiving device) at the same package. There are two interactions between the transmitting device and the receiving device on the same substrate. One is the optical crosstalk which is optical coupling between the PD and the LD. The other is the electric crosstalk which is conveyed from the LD to the PD by electromagnetic waves. Both kinds of crosstalk are difficult for the LD/PD module to conquer. This invention aims at solving the optical crosstalk.

There are several versions of the bidirectional LD/PD module for making use of a single fiber both for transmission and reception with regard to the modes of signal separation of the transmitting light and the receiving light. A typical signal separation device is a WDM (wavelength division multiplexer) which divides the common path spatially to a transmission path and a reception path by the difference of the light wavelengths. The WDM separation alleviates the difficulty of the optical crosstalk, since the WDM allots different paths to the LD and the PD for separating them spatially. A special disposition is a serial alignment of the PD and the LD on the same straight line. In this case, most of the transmission path is common with the reception path. The common path type module is suffering from more serious crosstalk problem.

This application claims the priority of Japanese Patent Applications No.11-201519(201519/19990) filed on Jul. 15, 1999 and No.11-260016(260016/1999) filed on Sep. 14, 1999, which are incorporated herein by reference.

2. Description of Related Art

FIG. 1 shows a typical multiwavelength bidirectional optical communication system having LD/PD modules at a central station and at a subscriber port. At the station, an $LD_1$ generates downward signals. The downward signals travel through an optical fiber 1, a WDM 2, an optical fiber 3, another WDM 4 and an optical fiber 5 to a $PD_2$ at the subscriber site. The $PD_2$ converts the downward optical signals to electric (received) signals. At the ONU (optical network unit) terminal, a subscriber $LD_2$ generates upward optical signals. The upward signals spread through an optical fiber 6, the WDM 4, the fiber 3, the WDM 2 and the fiber 7 and attain at a $PD_1$ at the station. The $PD_2$ converts the light signal from the subscriber into electric signal. The single fiber 3 enables both the upward signals and the downward signals to spread in both directions between the central station and the ONU terminal. The WDM 2 at the station alternatively allocates the downward signals and the upward signals into the fiber 1 or fiber 7 by the difference of the wavelengths. The downward light wavelength is denoted by $\lambda_2$. The upward light wavelength is designated by $\lambda_1$. Both signals are propagating in both directions in the same fiber 3. The WDM 4 at the subscriber port (ONU) alternatively allocates the downward signals and the upward signals into the fiber 5 or fiber 6 by the difference of the wavelengths. The ONU receives the downward (receiving) signals $\lambda_2$ by the $PD_2$. The $LD_2$ generates the transmission (upward) signals $\lambda_1$ at the ONU. Electric circuits following the $PD_2$ and the $LD_2$ are omitted in FIG. 1.

The words of "transmitting" or "receiving" signals have reverse directions (or inverse flows) at the station and at the ONU. In the description, the words should be defined at the ONU site. Thus, the upward light $\lambda_1$ corresponds to the transmitting signals. The downward light $\lambda_2$ carries the receiving signals. The prior art (multiwavelength bidirectional communication) of FIG. 1 separates the $PD_2$ and the $LD_2$ spatially by dividing the light paths by the WDM.

FIG. 2 shows a prior multiwavelength unidirectional optical communication system for transmitting various signals from a central station in a downward direction to a subscriber port. At the station, an $LD_1$ and an $LD_2$ generate different downward signals of $\lambda_1$ and $\lambda_2$. The downward signals travel through an optical fiber 1 or 7, a WDM 8, an optical fiber 3, another WDM 4 and an optical fiber 5 or 6 to a $PD_1$ or a $PD_2$ at the subscriber site. The WDM 4 separates two different signals by the difference of the wavelengths $\lambda_1$ and $\lambda_2$. The $PD_1$ senses $\lambda_1$. The $PD_2$ detects $\lambda_2$. Crosstalk occurs between $PD_1$ and $PD_2$ also in the multiwavelength unidirectional system.

FIG. 3 is a sectional view of a prior art PD module which has widely been used as a receiving device in the optical communication network having the spatially separated paths as shown in FIG. 1 or FIG. 2. The PD module has a metallic bottom circular stem 10 with lead pins 9 extending downward. A PD chip 12 is mounted via a submount 11 onto the stem 10. A thin metal cap 14 having a lens 13 is adjusted and welded on the stem 10. A cylindrical sleeve 15 is adjusted and welded on the stem 10 above the cap 14. A ferrule 16 is inserted, adjusted and fixed in an axial hole of the sleeve 15. The ferrule 16 clamps an end of an optical fiber 17. The end of the ferrule 16 is slantingly polished. An elastic bend-limiter 18 caps the top end of the sleeve 15 for protecting the fiber 17 from overbending. FIG. 1 and FIG. 2 include LD modules in addition to the PD modules explained by FIG. 3. The LD module is omitted to describe, since it is simply obtained by replacing the PD chip with an LD chip in the module of FIG. 3.

This invention is applicable to the spatially separating LD/PD or PD/PD modules as shown in FIG. 1 or FIG. 2. The prior PD module of FIG. 3 has a three-dimensional structure making use of a metallic package. The expensive metal package hermetically seals the PD device and shields the PD from external noise. Although the metal-can PD module has advantages of the sealing property and the shielding property, such a PD module has drawbacks of the number of parts, the necessity of adjustment, the number of steps of fabrication and the high cost. High cost prevents the metal-can type PD, LD or LD/PD modules from pervading widely.

Flat planar type LD, PD or LD/PD modules have been intensively investigated as low-cost devices. The flat planar type is called "PLC (planar lightguide circuit)"-type. FIG. 4 denotes an example of a PLC type PD module containing a bottom-incidence type PD. This invention can also be applied to the PLC module, which is now explained preliminarily. The PLC module is constructed upon a rectangular silicon bench (Si-bench) 19. The Si-bench 19 has a V-groove 20 formed by selectively etching the Si substrate from an end to a midway point in an axial direction in the middle. A slanting mirror plane 21 is formed by the same etching at the final end of the V-groove 20. A PD chip 23 is mounted just above the slanting mirror plane 21 upon the Si-bench 19. The PD chip 23 is a bottom surface incidence type PD with a light sensing part 24 at the top. An optical fiber 22 is fitted into and fixed to the V-groove 20. The light beam emanating from the fiber 22 travels in the V-groove 20 and shoots the mirror 21. Being reflected upward by the mirror 21 the signal light goes into the PD 23 via the bottom surface and attains to the sensing part 24. A photocurrent flows in proportion to the power of the signal light. The PLC type module succeeds in excluding the adjustment operation. Exclusion of adjustment alleviates the cost by facilitating production.

Both the PD modules of FIG. 3 and FIG. 4 can be applied for detecting the receiving signals separated by the WDMs in FIG. 1 and FIG. 2. The WDM is made, for example, by making a light waveguide branch having wavelength selectivity in a lightguide layer on a Si substrate. WDMs have various types with different shapes, different materials or different principles. FIG. 5 shows a prism type WDM. The WDM has two transparent glass columns 25 and 26 with a rectangular triangle section. The glass columns have a slanting surface coated with a dielectric multilayer 27. The dielectric multilayer 27 has wavelength sensitivity which allows one wavelength to pass through but reflects the other wavelength. The sensitivity enables the WDM to integrate the receiving light and the transmitting light. The reciprocal property of reflection or refraction laws allows the same WDM to act both as a wavelength integrating device and a wavelength separating device. In FIG. 5, the $\lambda_2$ receiving light going out of a fiber 28 is reflected by the dielectric layer 27 and reaches a PD 30. The transmitting light $\lambda_1$ made by an LD 29 goes through the dielectric layer 27 and enters the fiber 28. This invention can contribute to such an LD/PD module including a PD and an LD spatially separated by the WDM.

The WDM separating type LD/PD modules, however, are less significant than unseparating path type LD/PD modules for the present invention. The unseparating path type LD/PD modules mean the module which has a PD without an inherent path separated from the LD path. The unseparating type modules have been first proposed by the present Inventors. The unseparated path type LD/PD module aligns a PD and an LD on an axial line which is an extension of the optical fiber. The PD has no exclusive path different from the path of the LD. Alignment of the PD and the LD on the same axial line simplifies the structure of the module. This is a strong point. The same path for the LD and the $PD_1$ however, enhances the difficulty of the crosstalk more seriously than the WDM separating type LD/PD module. FIG. 6 denotes an example of the unseparated path type LD/PD which has bigger significance to the present invention. A direct purpose is to solve the problem of the crosstalk in the unseparated path type LD/PD modules of FIG. 6.

In the figure, a dotted rectangle denotes a housing (package) 31. The housing 31 has a Si-bench which is omitted here for simplicity. An optical fiber 32 is mounted in an axial direction in the housing 31. An LD 33 is installed at an extension of the fiber 32 in the housing 31. A WDM filter 35 slantingly cuts the fiber 32 at a spot distanced from the LD 33. The WDM filter 35 discriminates the light by the wavelength. A PD 34 is mounted above the WDM filter 35. The inherent path from the WDM 35 to the PD 34 is quite short. The LD 33 yields strong transmission light $\lambda_1$ of about 1 mW or more. The LD-emitted strong light travels to the left in the fiber, passes the WDM 35 and makes a long journey in the fiber 32 to e.g., the station. The receiving light $\lambda_2$ propagating to the right in the fiber, is reflected by the WDM 35 to the PD 34. A receiving region 36 of the PD 34 detects the receiving light $\lambda_2$. The transmitting light $\lambda_1$ is strong light. The receiving $\lambda_2$ is weak light. $\lambda_1$ and $\lambda_2$ have a common path from the beginning end to the WDM. The propagating directions are reciprocal for $\lambda_1$ and $\lambda_2$ and the WDM 35 separates $\lambda_1$ and $\lambda_2$. Sometimes the strong LD light partially invades into the PD 34 due to the short distance between the common axial line and the PD. The invasion of the LD light causes the optical crosstalk. Even a small rate of the LD light raises a large noise in the PD, since the LD power is strong enough and the receiving light is weak.

If a conventional PD as shown in FIG. 7 were used as the PD in FIG. 6, the invasion of the strong LD power would cause more than noise due to the wide range of sensitivity. The LD-noise would prevail over the receiving signal in the PD. The S/N rate (signal/noise rate) would be far smaller than 1. The conventional InP type PD chip is fabricated from an epitaxial wafer having an n-InP substrate 37 and epitaxial layers consisting of an n-InP buffer layer 38, an n-InGaAs light receiving layer 39 and an n-InP window layer 40 epitaxially deposited in turn on the n-InP substrate 37. A p-region 41 is formed by diffusing zinc (Zn) from the center of the n-InP window layer 40. An annular p-electrode 42 is formed on the p-region 41. An antireflection film 43 is made on the p-region 41 within the annular p-electrode 42. A passivation film 44 is deposited on the InP window layer 40 out of the p-electrode 42 for protecting the pn-junction. An n-electrode 45 is deposited on the bottom of the InP substrate 37. In the case of the upper surface incidence type as shown in FIG. 7, the bottom n-electrode 45 is an overall coating metal film and the top p-electrode 42 is annular. In the case of the bottom incidence type, the bottom n-electrode should be annular and the top p-electrode should be an overall metal film.

FIG. 8 shows the sensitivity distribution of the prior InGaAs-type photodiode (PD) of FIG. 7 A front falling part (P) at shorter wavelengths corresponds to the band gap of the InP window layer 40. The light of a shorter wavelength than P is insensitive to the PD, because the shorter wavelength light is absorbed by the InP window layer 40. Another falling part (R) at longer wavelengths corresponds to the band gap of the InGaAs light receiving layer 39. The light having longer wavelength of lower energy (hv) is insensitive to the PD, because the longer wavelength light is not absorbed by the InGaAs light receiving layer 39. Thus, the conventional InGaAs-type PD has a wide range (Q) of sensitivity from the band gap (P) of the InP window layer 40 to the band gap® of the InGaAs light receiving layer 39. The sensitivity range (Q) includes both 1.3 $\mu$m and 1.55 $\mu$m bands. The prior PD has sufficient sensitivity both for the 1.3 $\mu$m and 1.55 $\mu$m bands.

The prior PD of FIG. 7 is generally adopted for sensing the infrared light in the optical communication. The PD has a wide sensitivity range from 1 $\mu$m to 1.65 $\mu$m as shown in FIG. 8. The wide sensitivity range is a strong point of the PD because of the probable common use of the PD both for receiving the 1.3 $\mu$m and 1.55 $\mu$m light. However, when the wide sensitive PD is used in the LD/PD module, the PD is apt to cause large crosstalk owing to the wide sensitivity range including the 1.3 $\mu$m band.

If the transmitting light $\lambda_1$ had lower energy than the receiving light $\lambda_2$ ($\lambda_1 > \lambda_2$), a contrivance of the light receiving layer would enable the PD to decrease the crosstalk. The PD can sense the light having higher energy than the band gap energy of the light receiving layer by absorbing the light at the light receiving layer and converting the light energy into photocurrent. But the PD is insensitive for the light having energy lower than the band gap of the light receiving layer, since the light passes through the light receiving layer without loss. If the light receiving layer were made of a material having a band gap of an intermediate energy between the transmission light energy and the receiving light energy, the PD would sense only the receiving light exclusively.

If the transmitting light $\lambda_1$ had higher energy than the receiving light $\lambda_2$ ($\lambda_1 < \lambda_2$), any contrivance of the light receiving layer would fail to decrease the crosstalk. The crosstalk cannot be suppressed by changing the band gap of the light receiving layer at all. Such case is just an object of the present invention. Namely, the transmission wavelength $\lambda_1$ is shorter than the receiving wavelength $\lambda_2$ in the present invention ($\lambda_1 < \lambda_2$). For example, the transmission light is $\lambda_1$=1.3 82 m and the receiving light is $\lambda_2$=1.55 $\mu$m. Poor performance of the WDM will induce large crosstalk in the WDM-separated type of FIG. 1 or FIG. 2. The unseparated path type LD/PD module incurs far greater crosstalk due to the short distance between the PD and the axial common signal line.

The reason why the LD/PD module of FIG. 6 is liable to invite large optical crosstalk will be described here. In FIG. 6, all the strong transmitting light emitted from the LD does not go into the optical fiber 32. A part of the laser (LD) light shoots the platform or the resin outside of the fiber due to the wide aperture of the LD light. The extra light is reflected, refracted and scattered by the platform (Si-bench) or the resin. Unfortunately, the silicon (Si-) bench is transparent to the LD transmitting light $\lambda_1$. The resin enclosing the LD is also transparent to the LD infrared light. This is an origin of the difficulty of the optical crosstalk. The Si bench and the resin reflect, refract and scatter the stray LD light. Scattering direction or scattering power depends upon the distribution of the resin, the shape of the platform or the disposition of the LD or PD. The loci of the scattering, refracting or reflecting light is complex. Whole of the platform seems to glow brightly to the PD. The random LD light out of the fiber is called "stray" light or "scattered" light.

The LD light is invisible to human eyes but sensible to the PD. The stray light $\lambda_1$ goes into the PD in various directions at various heights as inner noise. The noise LD light invades into the PD via the upper surface, the bottom surface and the side surfaces. Then, the stray LD transmission light causes the crosstalk without entering the optical fiber. Since the stray light does not pass the WDM filter, the stray light cannot be suppressed by an improvement of the performance of the WDM at all. Furthermore, the LD light once going into the fiber sometimes induces the crosstalk due to the leak from the fiber owing to the scattering. An increase of the LD power makes it difficult to suppress the leak of the LD $\lambda_1$ light. The NVDM is indifferent to the stray LD light.

Nobody had been aware of the fact. The skilled has believed that the imperfection of the WDM filter would invite the LD light to invading to the PD. They thought that the requisite should be a contrivance of eliminating the LD light in the short path from the WDM to the PD sensing region. The description of the present invention discriminates two modes of the noise LD light by calling the LD light not entering the fiber "stray light" and the LD light once guided into the fiber but refracted by the WDM to the PD "leak light".

The Inventors had once contrived a superb PD having a selective absorption layer which does not absorb the $\lambda_2$ receiving light but absorbs the LD $\lambda_1$ light in the epitaxial layers. ① Japanese Patent Laying Open No.11-83619 (83619/1999) (Applicant: Sumitomo Electric Industries, LTD., Inventors: Yoshiki Kuhara, Hiromi Nakanish Hitoshi Terauchi, filled on Sep. 3, 1997) proposed such a PD. FIG. 9 shows the structure of the PD chip proposed by ①. An n-type InGaAs light receiving layer 47 is grown on an n-type InP substrate 46. A p-type region 48 is made at a central part of the n-InGaAs light receiving layer 47 by diffusion zinc (Zn) which is a p-dopant. A pn-junction denoted by a dotted curved line is formed as an interface between the n-type region and the p-type region. An i-layer (depletion layer) 49 accompanies the pn-junction just below. The p-region 48 has a p-electrode 50 on the top surface. A passivation film 51 (for example, SiN) is made on the n-InGaAs light receiving layer 47 out of the p-electrode 50 for protecting the edge of the pn-junction. An n-type InGaAsP absorption layer 52 is formed on the bottom of the n-InP substrate 46. The InGaAsP absorption layer 52 was the novel point of ①. An annular n-electrode 53 having an opening is formed upon the bottom of the absorption layer 52. The central opening of the n-electrode 53 is an entrance aperture of the PD chip. The entrance aperture is protected by an antireflection window 54 coating the absorption layer 52.

FIG. 10 denotes more a detailed structure of the PD chip suggested by ①. In practice, an n-InP buffer layer 56 is inserted between the n-InP substrate 46 and the n-InGaAs light receiving layer 47 for improving the crystallographic property of the light receiving layer 47. An n-InP window layer 55 is formed upon the InGaAs light receiving layer 47. Zn is thermally diffused from the InP window layer 55 to the InGaAs receiving layer 47 for making the p-region 48. If the PD lacked the InGaAsP absorption layer 52, the PD would have a wide sensitivity range (Q) as explained by referring to FIG. 8 due to the InP substrate 46 and the InP buffer layer 56 which give a tolerant lower limit (P).

The example is a bottom-incidence type PD, for example, applicable to the module of FIG. 6. The novel point is the InGaAsP absorption layer 52 in ①. Quaternary compound InGaAsP allows free choice of the band gap and the lattice constant. Semiconductors or insulators generally can absorb the light of energy higher than the band gap but cannot absorb the light of energy lower than the band gap. Wavelengths are inversely proportional to energy. A band gap wavelength $\lambda g$ is defined as the wavelength of the light having the energy equal to the band gap. Lower energy light ($\lambda > \lambda g$) passes the material but higher energy light ($\lambda < \lambda g$) is partially or entirely absorbed by the material. Then, if the band gap of the quaternary InGaAsP is chosen as an intermediate value between the transmitting wavelength $\lambda_1$ and the receiving wavelength $\lambda_2$, the InGaAsP would not absorb the $\lambda_2$ but would selectively absorb the $\lambda_1$ light. This is the basic idea of ①.

For example, if the transmitting light wavelength is $\lambda_1 = 1.3$ $\mu$m and the receiving light wavelength is $\lambda_2 = 1.55$ $\mu$m, the band gap of the absorption layer should be about $\lambda g = 1.40$ $\mu$m~$1.46$ $\mu$m. The absorption layer has, e.g., carrier (electron) concentration of $1 \times 10^{18}$ cm$^{-3}$ and a thickness of about 5 $\mu$m. This is a considerably thick layer. The carrier concentration is also high. The large thickness (e.g., 5 $\mu$m) is required for absorbing all the 1.3 $\mu$m light without the rest. The InGaAsP of $\lambda g = 1.40$ $\mu$m~$1.461$ $\mu$m has attenuation coefficient $\alpha = 10^4$ cm$^{-1}$ for 1.3 $\mu$m light. A 5 $\mu$m-thick layer gives attenuation of $\exp(-\alpha d) = 0.007$ which means very small transparency of 0.7%. The high electron concentration ($10^{18}$ cm$^{-3}$) aims partially at prohibiting the forward resistance from rising due to the absorption layer and partially at facilitating the recombination of the electron-hole pairs yielded by the light. The absorption layer is effective to suppress the optical crosstalk between the PD and the LD, since the absorption layer does not absorb the receiving light $\lambda_2$ (1.55 $\mu$m) but selectively absorbs the LD transmission light (1.55 $\mu$m).

FIG. 11 shows the wavelength dependence of the transparency of the InGaAsP absorption layer 52 explained in ①. The compound ratio is selected for giving a band gap wavelength e.g., $\lambda g = 1.42$ $\mu$m ($\lambda g = 1.40$ $\mu$m~$1.46$ $\mu$m). The absorption layer absorbs the light of a shorter wavelength than 1.42 $\mu$m but allows the light of a longer wavelength than 1.42 $\mu$m to pass. The sensitivity is 1A/W for 1.55 $\mu$m but less than 0.01 A/W for 1.3 $\mu$m. The extinction ratio is less than ⅟₁₀₀ (20 dB).

Since the PD is the bottom incidence type, a mixture of the $\lambda_1$ and $\lambda_2$ light goes into the PD from the bottom aperture. The $\lambda_1$ light is fully absorbed by the absorption layer 52. No $\lambda_1$ light reaches the light receiving region (the depletion layer). The PD senses no $\lambda_1$ light. The WDM-scattered LD light causes no crosstalk in the improved PD. The PD is, in particular, effective to the unseparated path type LD/PD module as shown in FIG. 6. The PD is also effective to the separated path type LD/PD module of FIG. 1 or FIG. 2, since the absorption layer can annihilate the extra $\lambda_1$ light which has not been eliminated by the WDM filter. ① is a superb, excellent invention which provides the n-InP substrate 46 with the n-InGaAs light receiving layer 47 on the upper surface and the n-InGaAsP absorption layer 52 on the bottom surface. Epitaxy makes both the InGaAs light receiving layer 47 and the InGaAsP absorption layer 52. Both surface film formation makes the epitaxy difficult. The allocation of the absorption layer and the light receiving layer on both surfaces brings about an advantage annihilating electron-hole pairs borne by the absorption of $\lambda_1$ in the absorption layer 52 without making an influence upon the light receiving layer 47. The design of the thickness of the absorption layer required to consider the attenuation factor $\exp(-\alpha d)$ for the 1.3 $\mu$m light. It was supposed that the absorption layer would annihilate the obstacle $\lambda_1$ light which escapes from the WDM filter to a enough small value of $\exp(-\alpha d)$. The absorption layer was thought to remove the crosstalk between the transmission signals and the receiving signals completely.

The assumption turned out not to be entirely true. ① is effective indeed to annihilate the $\lambda_1$ (1.3 $\mu$m) leak which goes via the bottom into the PD, because the light passes the absorption layer. The WDM passing leak light is not the whole of the light emanating from the LD and going into the PD. Besides the WDM passing leak, some part of the LD light attains to the PD after being scattered or reflected at the fiber end, the resin or the substrate several times. This $\lambda_1$ light is called stray light for discerning it from the WDM-passing leak light. The LD chip has a short resonator length which is equal to the length of the PD chip. The short resonator admits the LD emitting light to spread in a wide aperture both vertically and horizontally because of using no lens. Considerable part of the LD light does not go into the fiber. Fiber-excluded, scattered LD light illuminates the whole of the Si bench brilliantly, in particular, in the unseparating type LD/PD module aligning the PD and the LD on an extension of the fiber axial line as shown in FIG. 6. This fact is beyond the imagination of the skilled. Since the Si bench is transparent to the $\lambda_1$ light, the $\lambda_1$ light propagates in the Si bench and the resin. The Si bench and the resin glitter with $\lambda_1$. Some part of the scattered $\lambda_1$ attains to the PD without passing the WDM. Enhancement of the WDM performance has no effect on preventing the fiber-excluded $\lambda_1$ from shooting the PD. It is important to remove the fiber-excluded $\lambda_1$ scattered (stray) light by the bench, the resin or the package as well as to eliminate the leak $\lambda_1$ light due to the imperfection of the WDM.

As defined before, the $\lambda_1$ light emanated from the LD but excluded from the fiber is called stray light. The stray $\lambda_1$ fills the housing as a whole. Although the PD is the bottom-incidence type, the $\lambda_1$ light stray does not necessarily come into the PD via the bottom. The PD has a big thickness of about 200 $\mu$m. Some $\lambda_1$ stray light obliquely enters the PD via the sides. Some scattered stray light shoots the top of the PD. Other stray light goes into the PD via the bottom. Various paths guide the stray $\lambda_1$ light to the PD. The stray $\lambda_1$ light invading from the sides or the top makes its own way to the depletion layer 49 in the InGaAs receiving layer without touching the absorption layer 52. The stray light generates photocurrent in the depletion layer 49 or the p-region 48. This is noise current for the PD. The noise-generation is called crosstalk. Namely, the bottom absorption layer is impotent to prevent the stray light from entering the PD via the sides or the top. Furthermore it turns out that the side-top entering stray light is rather more powerful than the bottom entering stray light.

For example, it would be possible to widen the p-electrode 50 (in FIG. 9) on the light receiving layer and cover the other part of the receiving layer with an opaque film for suppressing the top entering stray light. It is far difficult to suppress the side-entering stray light. PD chips are made by repeating epitaxy, diffusion, lithography or other wafer processes on a circular wafer and by scribing the wafer into plenty of chips along the cleavage lined lengthwise and crosswise. It is impossible to treat with the sides of the chips any more. The height of the sides is about 200 $\mu$m. The wide sides are not protected with any opaque films. The sides are exposed to a jam of the stray light.

The wavelength selectivity of WDM filters or WDM couplers is 15 dB to 20 dB at present. The receiving port requires at least 30 dB or desirably 40 dB of the wavelength selectivity as a whole. For example, if the LD power is 1 mW (=0 dBm), the least receivable power is −30 dBm and the S/N ratio of the noise ($\lambda_1$) to the signal to the PD is −10 dB, the required whole wavelength selectivity is 40 dB (30 dB+10 dB). Further, if the least receivable (detectable) power is −35 dB and the S/N ratio to the PD is −15 dB (about a thirtieth), the required wavelength selectivity is 50 dB (35 dB+15 dB).

SUMMARY OF THE INVENTION

A purpose of the present invention is to provide a PD structure which enables the PD to prevent both the stray LD light and the leak LD light from invading the PD in the LD/PD module having an LD yielding transmitting light of a shorter wavelength and the PD sensing receiving light of a longer wavelength.

To solve the problem, the present invention proposes two kinds of improved PDs. One PD (1) of the present invention has an absorption layer just below the light receiving layer but above the substrate. Namely, the absorption layer is sandwiched between the substrate and the light receiving layer. The absorption layer has the wavelength selectivity of allowing $\lambda_2$ to pass but annihilating $\lambda_1$. This is called a "single absorption" type. The other PD (2) of the present invention has an absorption layer just below the light receiving layer but above the substrate and another absorption layer below the substrate. Namely, the first absorption layer is sandwiched between the substrate and the light receiving layer. The second absorption layer covers the bottom of the substrate. Two absorption layers sandwich the substrate. This is called a "double absorption" type.

(1) single absorption type

The PD has a single absorption layer below the light receiving layer and above the substrate. The previous PD ①  has an absorption layer below the substrate as shown in FIG. 9 or FIG. 10. Unlike ①, this improved PD (1) has an absorption layer just above the substrate but beneath the light receiving layer. The absorption layer is thus sandwiched between the substrate and the light receiving layer. The absorption layer of the improved PD (1) is nearer to the light receiving layer than ①. In addition to the bottom-entering $\lambda_1$ light, the present invention absorption layer can annihilate the side-entering $\lambda_1$ light or the slantingly-entering $\lambda_1$ light. The noise $\lambda_1$ light does not attain to the sensing region (depletion layer or pn-junction), which decreases the crosstalk from the LD to the PD.

(2) double absorption type

The PD has a first absorption layer below the substrate and a second absorption layer below the light receiving layer and above the substrate. Unlike ① (FIG. 9 or FIG. 10), this improved PD (2) has two absorption layers. The first absorption layer covering the bottom of the substrate aims at annihilating the leak $\lambda_1$ light which comes into the PD via the WDM and the PD bottom. The first absorption layer compensates the imperfection of the WDM by eliminating the leak. The second absorption layer above the substrate below the light receiving layer has the role of eliminating both the $\lambda_1$ stray light and the $\lambda_1$ leak light. The second absorption layer can absorb widely the side-horizontally or side-slantingly entering $\lambda_1$ stray light besides the bottom entering light. The allotment of the roles is;

First absorption layer (bottom surface of substrate)= removal of leak light.

Second absorption layer (top surface of substrate)= removal of stray and leak light.

The $\lambda_1$ LD light which is noise to the PD is doubly absorbed by the first absorption layer and the second absorption layer. The $\lambda_1$ does not reach the sensing region of the PD. The PD does not sense $\lambda_1$, which depresses the optical crosstalk from the LD to the PD.

The present invention determined the compound ratio of the quaternary mixture InGaAsP of the absorption layer for providing the band gap wavelength $\lambda g$ with an intermediate value between $\lambda_1$ and $\lambda_2$ ($\lambda_1 < \lambda g < \lambda_2$). If $\lambda_1 = 1.3$ μm and $\lambda_2 = 1.55$ μm, 1.3 μm$<\lambda g<$1.55 μm.

The thickness of the absorption layer relates to the annihilation rate of $\lambda_1$. The thickness d should range from 3 μm to 10 μm. About 5 μm is a preferable thickness. Too thin an absorption layer cannot fully kills the $\lambda_1$ light. Too thick an absorption layer raises the cost through an increment of the material cost and the long layer growing time. Besides, a more than 5 μm thick InGaAsP layer would be subject to degradation of the crystal structure. From the viewpoint of crystallography, the absorption layer should not surpass 5 μm in thickness. The thickness will be considered later more in detail.

Another property for defining the absorption layer is carrier concentration. The carrier (electron) concentration should be rather high. A preferable carrier concentration is about $10^{18}$ cm$^{-3}$. Too low carrier concentration would bring about the inconvenience of enhancing the forward resistance of the PD and taking a long time for recombining the electron-hole pairs excited by the $\lambda_1$ LD light in the absorption layer. Unlike the previous ①, extinction of holes by the recombination with electrons is significant in the present invention, which will be later explained further.

The present structure has wide applicability. The present invention can be applied to various types of PDs, for example, the bottom-incidence type PD, the top-incidence type PD, the side-incidence type PD and the waveguide type PD.

There is an additional contrivance for killing the LD light further. The side-entering $\lambda_1$ is fully perished by building a peripheral p-region (diffusion shield layer) around the central p-region on the PD. An extra depletion layer below the peripheral p-region absorbs light of all wavelengths entering via the sides and makes electron-hole pairs which will die away in the peripheral p-region without arriving at the central depletion layer.

A further improvement is to make an InP window layer on the InGaAs light receiving layer. The window layer suppresses dark current and ensures long-term reliability. A passivation film protects the pn-junction appearing to the surface.

Insertion of a low-doped InP buffer layer between the absorption layer and the light receiving layer is effective to improving the crystal structure of the light receiving layer. High dopant concentration is apt to disturb the lattice structure. High dopant concentration often perturbs the crystal structure of the absorption layer. Here, the low-doped buffer layer contributes to recovering the lattice structure of the absorption layer.

The thickness d of the absorption layer is explained here in detail. α is the absorption coefficient, d is the thickness and T is the transparency of the absorption layer. Transparency is defined as a rate of the outgoing power to the incidence power. Assuming that no reflection occurs at the top surface and the bottom surface, the transparency T is related to d and α by the equation, $$T = \exp(-\alpha d) \quad (1)$$

α for $\lambda_1$ depends upon the compound ratio of InGaAsP. In the case of absorption edge wavelength of e.g., 1.42 μm ($\lambda g = 1.40$ μm~1.461 μm), the absorption coefficient is α=1×

$10^4$ cm$^{-1}$ for 1.3 μm. FIG. 22 denotes the relation between the thickness d and the transparency T. α depends on the wavelength (α=α(λ)). The absorption layer does not absorb 1.55 μm light (T=1) (α(1.55 μm)=0). T for 1.3 μm denotes the filtering effect (extinction ratio) of 1.3 μm to 1.55 μm.

$$\text{filtering effect} = -10 \log T = 4.343 \, \alpha d. \qquad (2)$$

If α=1×10$^4$ cm$^{-1}$, a 10 dB filtering effect (T=10%) requires a thickness more than d=2.3 μm from FIG. 22. A 20 dB filtering effect (T=1%) demands d=4.6 μm of the absorption layer. Due to the fluctuation of the thickness of epitaxial layers, the 20 dB filtering effect (T=1%) requires the absorption layer of a thickness d=4 μm to 6 μm. Namely, 5 μm is a desirable thickness for the absorption layer.

A thicker absorption layer may be more desirable for increasing the filtering effect. However, a thicker quaternary compound crystal layer degrades the crystal property of the absorption layer. From the standpoint of the crystal property, 5 μm is the preferable thickness. However, the InP buffer layer which improves the crystal property allows an about 10 μm thickness for the absorption layer.

Discussion over T is sufficient for suppressing the LD leak via the WDM. This invention aims at annihilating not only the leak light but also the stray light unlike prior art ①. One problem is fast recombination of carriers. The noise $\lambda_1$ (e.g.,1.3 μm) being absorbed by the absorption layer makes pairs of electrons and holes there. If the holes (minority carriers) crossed over the absorption layer to the above light receiving layer and recombined with electrons in the receiving layer, a photocurrent due to the noise $\lambda_1$ would flow in the PD and would blur the signal current. The holes (minority carrier) yielded in the absorption layer by the $\lambda_1$ light should be recombined with electrons (majority carriers) within the absorption layer. The absorption layer should have an enough thickness for allowing the holes to recombine with electrons and for restraining the holes from leaking into the light receiving layer. The absorption layer should be larger than the product of the hole lifetime and the hole velocity. Here, the absorption layer is an n-InGaAsP crystal. The majority carrier is an electron and the minority carrier is a hole. In the layer, electrons are majority carriers and the lifetime of the electron is insignificant.

Holes are minority carriers in the n-type absorption layer. Since the carrier (electron) concentration is large, there is no electric field (E=0) in the absorption layer like a metal. There is no electrostatic field there. Holes are not pulled by electric field in the absorption layer. However, there is hole density gradient in the layer. The hole density gradient pushes holes toward the region of lower hole density. The diffusion guides the holes toward the p-region. During the diffusion, the holes collide with majority electrons and recombine with the electrons. The recombination annihilates the holes in the absorption layer. The $\lambda_1$ yielded holes vanish in the absorption layer without inducing a photocurrent.

The diffusion distance from generation to extinction is called a diffusion length $L_d$. Hole diffusion distance is denoted by $L_{d\,h}$ and electron diffusion distance is designated by $L_{d\,e}$. The hole diffusion distance $L_{d\,h}$ is defined as a root of a product Dτ of the diffusion coefficient D and the hole lifetime τ. $L_{d\,h}=(D\,\tau)^{1/2}$. The diffusion coefficient D is defined as a limit of $x^2/t$ at t→0, where x is the displacement of the hole and t is the time of the diffusion. D=lim($x^2/t$).

In general, the electron diffusion distance $L_{d\,e}$ is long but the hole diffusion distance $L_{d\,h}$ is short in the InGaAsP crystal. If a p-type absorption layer were employed for absorbing the noise $\lambda_1$ light, the minority carriers (electrons) would have a long diffusion distance which would cause a real photocurrent in the PD and would lower the S/N rate. It is inconvenient to employ the long lifetime carrier as the minority carrier. Thus, the preferable minority carrier is a hole having a short lifetime and the favorable conduction type of the absorption layer is n-type which has holes as minority carriers.

The diffusion length depends upon the compound ratio of InGaAsP of course. The diffusion length also depends on the purity of the crystal. Purer crystal causes less times of collision of holes. High doped crystal shortens the lifetime of holes due to the frequent collision. In a high pure InGaAsP crystal of a carrier density n=10$^{15}$ cm$^{-3}$, the electron diffusion length is $L_{d\,e}$=6.0 μm and the hole diffusion length is $L_{d\,h}$=1.6 μm. An crystal of a lower purity shortens the diffusion lengths $L_{d\,e}$ and $L_{d\,h}$ owing to an increment of a recombination section (collision probability) (decreasing τ) through an increase of the majority carriers.

The hole diffusion length $L_{d\,h}$ decreases in proportion to a root of the carrier (electron) concentration n in the n-type region. The absorption layer is made of highly doped InGaAsP crystal (nearly n=10$^{18}$ cm$^{-3}$). The high dopant density (n=10$^{18}$ cm$^{-3}$) lowers the diffusion length to about a thirtieth (1/30) of the value in the high purity crystal (n=10$^{15}$ cm$^{-3}$). The hole diffusion length is estimated to be $L_{d\,h}$=0.05 μm in the absorption layer (n=10$^{18}$ cm$^{-3}$). $L_{d\,h}$=0.05 μm means that the hole density reduces to 1/e in a 0.05 μm distance.

Absorption does not mean an immediate extinction of the LD light power. At the instance of absorption, the light is converted into pairs of electrons and holes. α is a measure of the probability of the conversion. The InGaAsP layer having a large α converts almost all of the light into electron-hole pairs at a beginning part of the absorption layer. The diffusion of holes starts at an early part of the absorption layer. A 5 μm thick absorption layer attenuates the light power down to exp(−5/0.05)≈10$^{-44}$. The high carrier concentration n of the absorption layer aims at shortening the hole diffusion length $L_{d\,h}$ (denoted simply by "L" hereinafter). The lower limit of the carrier concentration n in the absorption layer depends upon the thickness d of the absorption layer. A bigger thickness d permits a smaller concentration n by admitting a longer diffusion length L.

Strictly speaking, the function of annihilating $\lambda_1$ should be considered by taking account of two different phenomena. One is a optoelectronic conversion from light to electron-hole pairs at a point distanced from the bottom of the absorption layer by z. The other is recombination of holes with electrons for extinction. The probability of the optoelectronic conversion is αexp(−αz)dz where dz is an infinitesimal thickness of the layer. A decreasing ratio of a hole borne at z against the recombination is given by exp{(z−d)/L} at the final point z=d of the layer, where L is the diffusion length, d is the thickness of the layer and z is an arbitrary point (0≦z≦d) in the layer. The surviving hole ratio S is given by an integration of the product of αexp(−αz) and exp{(z−d)/L} by z.

$$S = \alpha \int \exp(-\alpha z) \exp\{(z-d)/L\} dz \qquad (3)$$
$$= \alpha L (1 - \alpha L)^{-1} \{\exp(-\alpha d) - \exp(-d/L)\}$$

α has the same physical dimension as 1/L. α has little dependence upon the carrier concentration of the absorption layer. The hole diffusion length L deeply depends upon the concentration n. The pure InGaAsP of n=10$^{15}$ cm$^{-3}$ has a 1.6 μm hole diffusion length. The diffusion length is in proportion to the root of the concentration n. For a general n, the hole diffusion length L is $$L=1.6\times(10^{15}/n)^{1/2}(\mu m) \quad (4)$$

Substitution of (4) to (3) yields a general expression of S for arbitrary d and n, $$10\log S = 10\log\left[1.6\alpha\left(\frac{10^{15}}{n}\right)^{\frac{1}{2}}\left\{1-\frac{\alpha}{1.6\left(\frac{10^{15}}{n}\right)^{\frac{1}{2}}}\right\}\left[\exp(-\alpha d)-\exp\left\{-\frac{d}{1.6}\left(\frac{n}{10^{15}}\right)^{\frac{1}{2}}\right\}\right]\right] \quad (5)$$

This is the extinction rate of the receiving light to the transmission light. For example, more than 20 dB of extinction ratio is required (10logS<−20 dB). Eq.(5) teaches us the required carrier concentration n and the thickness d of the InGaAsP layer. For instance, d=5 $\mu$m and n=$10^{18}$ cm$^{-3}$ give S=−35 dB. And d=5 $\mu$m and n=$10^{17}$ cm$^{-3}$ give S=−30 dB. A low concentration n=$10^{17}$ cm$^{-3}$ is also permitted. This is a lower limit of the concentration. The upper limit of n is determined by the restriction of preventing the crystal property from degrading. The upper limit of n is n=$10^{19}$ cm$^{-3}$.

$$10^{17} \text{ cm}^{-3} \leq n \leq 10^{19} \text{ cm}^{-3} \quad (6)$$

The differences between the prior art ①and the present invention (A,B) are now explained. The prior art ①has an absorption layer on the bottom of the substrate. One (A) of the present invention has an absorption layer on the top surface of the substrate next to the light receiving layer. The other (B) of the present invention has two absorption layers sandwiching the substrate.

①; a single absorption layer below the substrate

A; a single absorption layer above the substrate below the light receiving layer B; two absorption layers; one below the substrate, the other above the substrate, In short, the present invention has an advantage of the wider solid angle Ω than ①, which is an aperture from the receiving region to the absorption layer. This invention is superior to ①in the width of the solid angel Ω. The breadth of the PD chip is denoted by W (e.g., 300 $\mu$m to 500 $\mu$m). The vertical distance between the light receiving layer and the absorption layer is denoted by g. The solid angle Ω which is an aperture looking from a point in the receiving (sensing) region at the absorption layer is given by $$\Omega=2\pi[1-g/\{(W/2)^2+g^2\}^{1/2}]. \quad (7)$$

In the present invention (A, B), the distance g between the absorption layer and the sensing region is short enough, e.g., about 2 $\mu$m to 10 $\mu$m but the half breadth W/2 is large, e.g., about 200 $\mu$m. Thus, this invention gives about Ω=2π which is half of the whole solid angle (4π).

On the contrary, the distance g including the substrate is about 200 $\mu$m to 300 $\mu$m in the prior art ①. The solid angle of ①is about Ω=π. Thus the aperture (solid angle Ω) of the present invention is twice as wide as ①. The wider aperture is more effective to protect the PD from the stray light. The protection by the present absorption layer is more effective than ①by a factor of 2. The present invention can be discriminated from the prior art ①by the simple geometrical advantage.

First, the first invention A is compared with the prior art ①. There is a technical advantage on fabrication of the present invention A over the prior art ①. The prior art ①requires twice epitaxial growths for making an epitaxial light receiving layer on the top surface and another epitaxial absorption layer on the bottom surface. ①requires two steps of epitaxial growth on both surfaces of the substrate. The double epitaxial growth enhances the cost of epitaxy for ①. This invention A can make the absorption layer and the light receiving layer by a single epitaxial growth on the top surface of the substrate. Single surface epitaxy alleviates the step of epitaxy, which lowers the fabrication cost for the present invention A.

Second, the second invention B is compared with the prior art ①. The invention B has two absorption layers; the first absorption layer is below the substrate and the second absorption layer is above the substrate. Almost all of the WDM leak light from the bottom surface is eliminated by the first absorption layer. Even if some of the leak light passes the first absorption layer, the second absorption layer annihilates the leak light completely. The second invention B has double protection of the PD from the stray and the leak LD light. The invention B is far superior to the prior art ①in the removal of the optical crosstalk.

This invention proposes a new PD without crosstalk for the LD/PD module of the multiwavelength bidirectional or unidirectional optical communication system. The PD (A) of Invention A has a single absorption layer between the substrate and the light receiving layer. The PD (B) of Invention B has two absorption layers; a first absorption layer is piled on the bottom of the substrate, a second absorption layer is sandwiched between the substrate and the light receiving layer. The LD emits strong transmission light $\lambda_1$. A part of the $\lambda_1$ is scattered at random. The scattered $\lambda_1$ light (stray) fills the package. The stray light $\lambda_1$ shoots the PD in all directions. Imperfection of the WDM allows the $\lambda_1$ to shoot the aperture of the PD. The absorption layers prevent the stray $\lambda_1$ and the leak $\lambda_1$ light from coming into the light receiving layer. In the double absorption layer PD(B), the second absorption layer is effective to get rid of the $\lambda_1$ stray light and both the first and second absorption layers are effective to eliminate the $\lambda_1$ leak light.

From the standpoint of suppressing the leak light $\lambda_1$, a single 10 $\mu$m thick absorption layer seems to be equivalent to an assembly of a first 5 $\mu$m thick absorption layer and a second 5 $\mu$m thick absorption layer. But it is not true. The absorption layer is a highly doped and quaternary mixture crystal. Too thick absorption layer degenerates the crystal property of the absorption layer. 10 $\mu$m is the upper limit which can maintain the good crystallographical property for the quaternary, high-doped absorption layer. It is better to make two 5 $\mu$m thick good absorption layers than to make a single 10 $\mu$m thick absorption layer from the viewpoints of both the crystal property and the extinction of noise $\lambda_1$ light.

The role of the second absorption layer is not rigorously equal to the role of the first absorption layer even for the leak $\lambda_1$ light deriving from the imperfection of the WDM. The holes borne in the first absorption layer are all annihilated, since the thick substrate separates the first absorption layer from the light receiving layer. The holes made in the second absorption layer are not fully eliminated. Some of the holes can attain to the light receiving layer and yield photocurrent, since the second absorption layer is in contact with the light receiving layer. The first absorption layer is superior to the second absorption layer in annihilating the leak light $\lambda_1$. The assembly of a 5 μm absorption layer and a 5 μm absorption layer of the present invention is more effective than a single 10 μm absorption layer.

This invention succeeds in reducing the optical crosstalk from the LD to the PD by suppressing the LD light $\lambda_1$ from coming into the light receiving layer. The PD of the invention is, in particular, effective to be applicable to the path unseparated type LD/PD module of FIG. 6. Of course, the PD of the present invention can be applied to the path-separated type LD/PD module shown in FIG. 1, FIG. 2 and FIG. 5.

BRIEF DESCRIPTION OF THE DRAWINGS

FIG. 12 is a section of Embodiment 1 of the present invention of a bottom incidence type PD.

FIG. 13 is a section of Embodiment 2 of the present invention of a bottom incidence type PD having a peripheral diffusion shield layer.

FIG. 27 is a section of Embodiment 14 of the present invention of a bottom incidence type having an SI-INP substrate, one absorption layer above the substrate, a peripheral diffusion shield layer, a bottom surface with an aperture and a top surface having both a p-electrode and an n-electrode.

FIG. 28 is a section of Embodiment 15 of the present invention of a bottom incidence type having an SI-InP substrate, one absorption layer above the substrate, another absorption layer below the substrate, a peripheral diffusion shield layer, a bottom surface with an aperture and a top surface having both a p-electrode and an n-electrode.

FIG. 29 is a section of Embodiment 16 of the present invention of a bottom incidence type having an $n^+$-InP substrate, two absorption layers above the substrate, a peripheral diffusion shield layer, an n-electrode with an aperture formed on a bottom surface of the InP substrate and a p-electrode formed on a top surface.

FIG. 30 is a section of Embodiment 17 of the present invention of a bottom incidence type having an $n^+$-InP substrate, two absorption layers above the substrate, an absorption layer below the substrate, a peripheral diffusion shield layer, an n-electrode with an aperture on a bottom surface of the absorption layer and a p-electrode formed on a top surface.

DETAILED DESCRIPTION OF THE PREFERRED EMBODIMENTS

Figure 1:
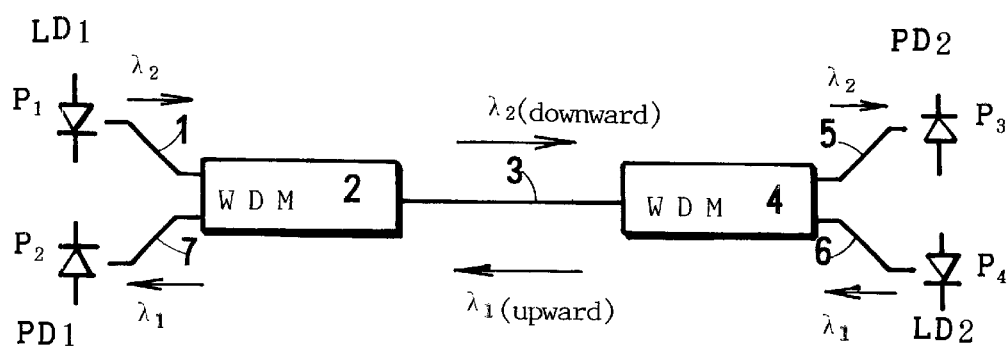
FIG. 1 is a schematic view of a multiwavelength bidirectional optical communication system as a candidate to which the PD of the present invention is applied.
Figure 2:
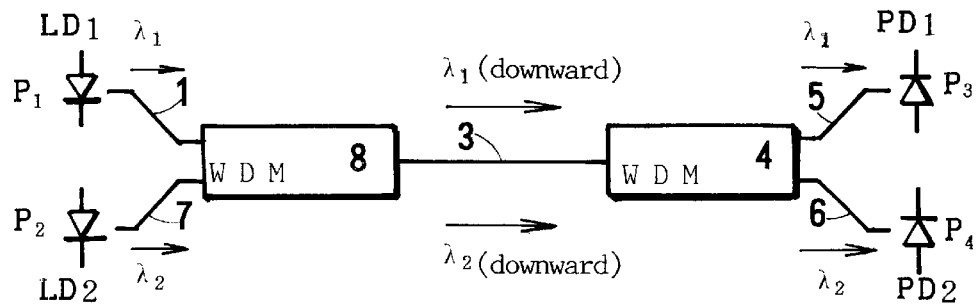
FIG. 2 is a schematic view of a multiwavelength unidirectional optical communication system as a candidate to which the PD of the present invention is applied.
Figure 3:
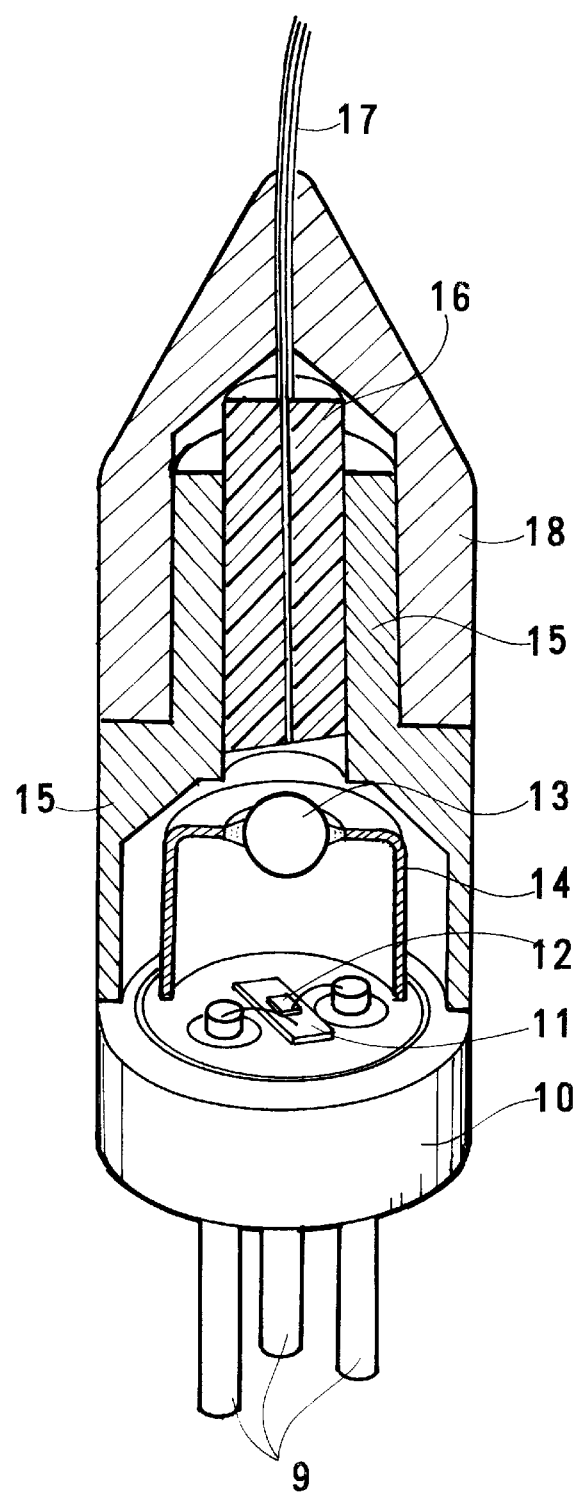
FIG. 3 is an oblique view of a vertical section of a prior art PD for an optical communication system.
Figure 4:
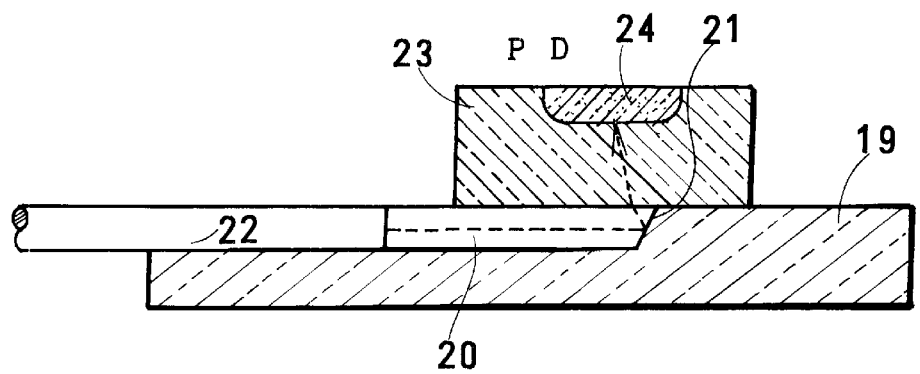
FIG. 4 is a vertical section of a planar waveguide circuit type PD module having a bottom incidence type PD.
Figure 5:
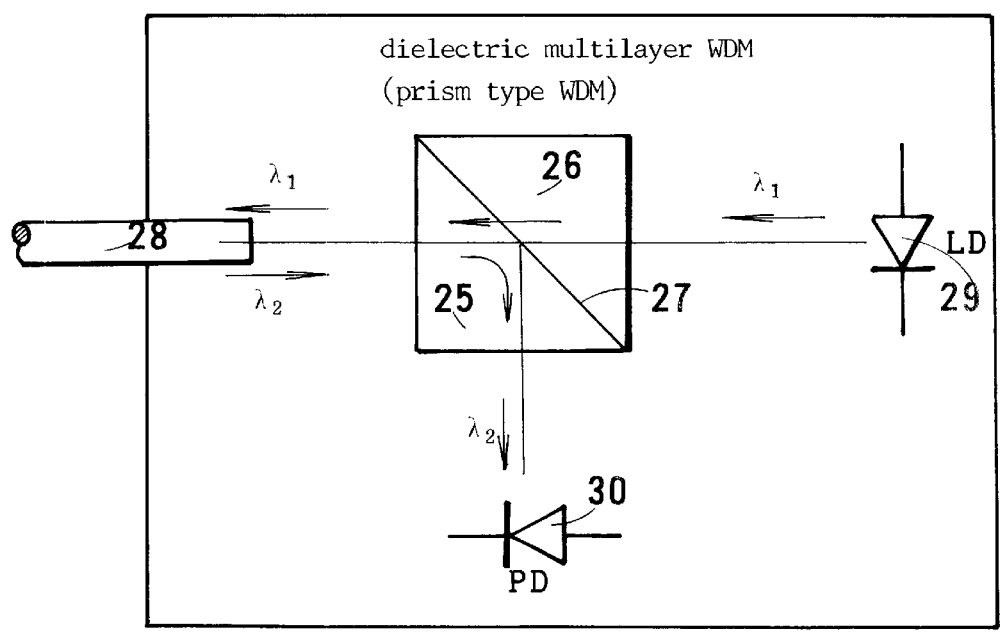
FIG. 5 is a schematic view of an LD/PD module having a dielectric multilayer WDM.

The following are 12 embodiments for Invention A (single absorption layer) and 7 embodiments for Invention B (two absorption layers).

Invention A: Single Absorption Layer Beneath the Light Receiving Layer Above the Substrate [Embodiment 1 (Bottom Incidence Type; Fundamental Form)]

FIG. 12 denotes Embodiment 1 applied to a bottom incidence type PD. A starting material is an $n^+$-InP wafer (substrate) 57. An $n^+$-InGaAsP absorption layer 58 and an n-InGaAs light receiving layer 59 are in turn epitaxially-grown on the $n^+$-InP substrate 57. The series layer structure of [substrate/absorption layer/light receiving layer] is the conspicuous feature of Invention A.

The $n^+$-InP substrate 57 has, for example, a thickness of 200 $\mu$m. The carrier (electron) concentration is $n=3\times10^{18}$ $cm^{-3}$. The $n^+$-InGaAsP absorption layer 58 has ,e.g., a 5 $\mu$m thickness and an $n=10^{18}$ $cm^{-3}$ carrier density. The n-InGaAs light receiving layer 59 is, for example, 3 $\mu$m to 4 $\mu$m in thickness and $n=10^{15}$ $cm^{-3}$ in carrier density.

A p-region 60 is made by diffusing zinc (Zn) at the center of the chip on the light receiving layer 59 of the epitaxial wafer, as shown in FIG. 12. The carrier (hole) concentration p is not constant in the p-region 60 which has been formed by the impurity diffusion. The Zn diffusion makes a pn-junction 61 at which the p-impurity concentration is equal to the n-impurity concentration of the n-InGaAs layer 59 ($p=n$; $10^{15}$ $cm^{-3}$) around the p-region 60 in the InGaAs receiving layer 59. Since the InGaAs light receiving region 59 has a small n-concentration, a thick depletion layer 62 appears beneath the pn-junction 61. A wide p-electrode 63 is formed on the p-region 60. The bottom incidence allows the p-electrode 63 to cover almost all of the p-region 60. A passivation film 64 is, deposited on the light receiving layer 59 around the p-electrode 63. The passivation film 64 is made, for example, of silicon nitride (SiN) for protecting top ends of the pn-junction 61. An annular n-electrode 65 is formed on the bottom surface of the $n^+$-InP substrate 57. Since the PD introduces light via the bottom surface, the n-electrode 65 on the substrate should have an aperture. An antireflection film 66 is deposited on the substrate bottom within the aperture of the n-electrode 65.

Going into the PD via the bottom surface, signal $\lambda_2$ light (A) passes the absorption layer 58 and attains to the depletion layer 62. The signal $\lambda_2$ (A) makes pairs of electrons and holes in the depletion layer 62 which is reversely biased by an electric field. The reverse bias gives the depletion layer the sensitivity. The reverse bias brings electrons to the n-region downward and brings holes to the p-region upward. The electron and the hole generate a photocurrent. The photocurrent flows from the n-electrode to the p-electrode in the PD. This is a normal operation of the PD for $\lambda_2$.

Going into the PD via the bottom surface, noise $\lambda_1$ (LD) light (B) extinguishes in the $n^+$-InGaAsP absorption layer 58, since $\lambda_1 < \lambda g$. No $\lambda_1$ reaches the above light receiving layer 59 or the depletion layer 62. The electrons and holes borne in the absorption layer 58 soon disappear in the same absorption layer without making photocurrent. The $\lambda_1$ (B) cannot make photocurrent. The PD has no sensitivity to the transmission $\lambda_1$ light (B) which enters the PD via the bottom aperture.

In addition to the $\lambda_1$ from the bottom, the absorption layer 58 well absorbs obliquely incidence $\lambda_1$ light (C) which enters via the side of the substrate. The oblique $\lambda_1$ cannot make photocurrent. The PD has no sensitivity also to the oblique incidence $\lambda_1$ (C). The absorption layer 58 annihilates both the stray $\lambda_1$ (C) and the leak $\lambda_1$ (B). The PD of Invention A is insensitive both to the stray (C) and the leak (B). The elimination of the stray (C) is in particular significant.

FIG. 12 shows a fundamental structure of the PD of Invention A. The fundamental PD of FIG. 12 reveals the function of suppressing the crosstalk of course. However, some improvements should be made on the fundamental PD in practice. For example, the PD is improved by adding an n-InP window layer on the n-InGaAs light receiving layer 59. The crystallographical property is enhanced by inserting an InP buffer layer between the substrate 57 and the InGaAsP absorption layer 58.

[Embodiment 2 (Bottom Incidence Type; Diffusion Shield Layer)]

FIG. 13 shows Embodiment 2 which has a p-type diffusion shield layer around the p-electrode or the central p-region. The peripheral diffusion shield layer is a similar p-region to the central p-region. The peripheral p-region is produced by the same step of making the central p-region.

Figure 8:
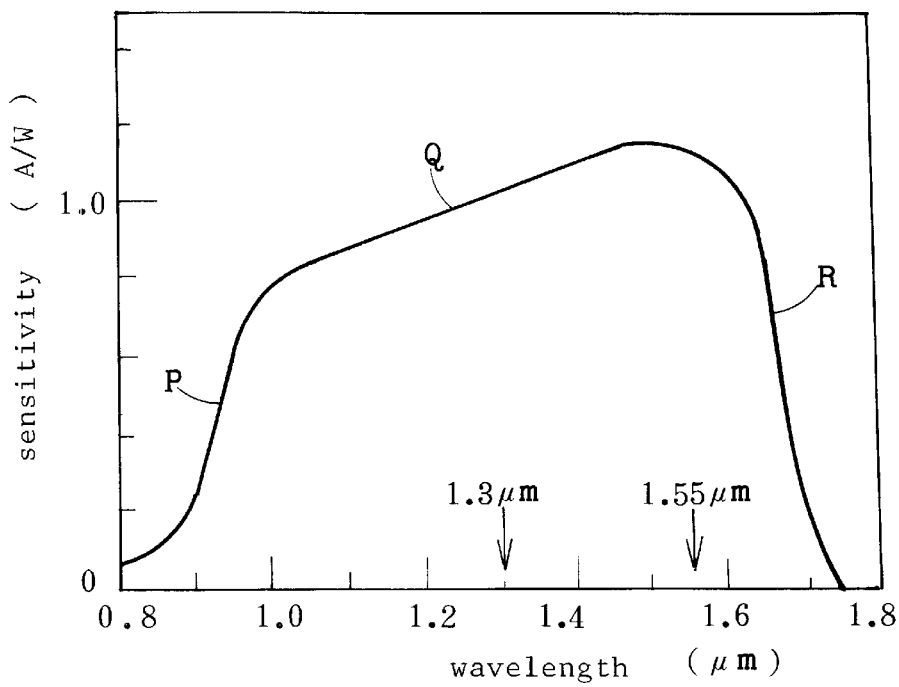
FIG. 8 is a graph of sensitivity of a prior art InGaAs-type photodiode as a function of wavelength.
Figure 9:
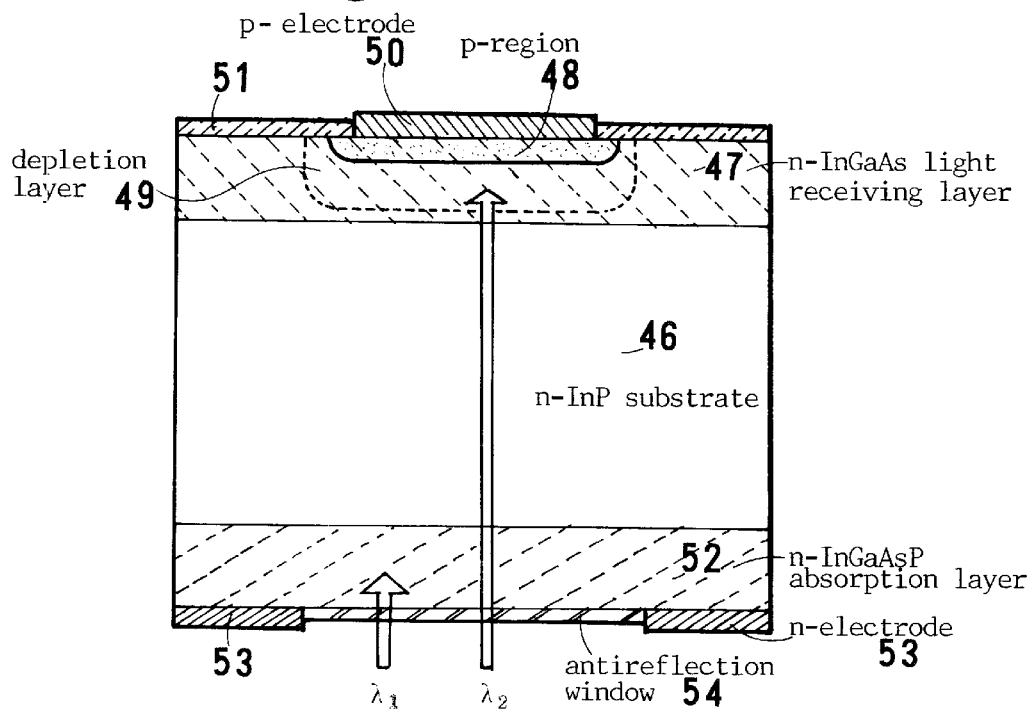
FIG. 9 is a vertical section of a photodiode, which was once proposed by the Inventors, for detecting only 1.55 μm light by annihilating 1.3 μm light.
Figure 10:
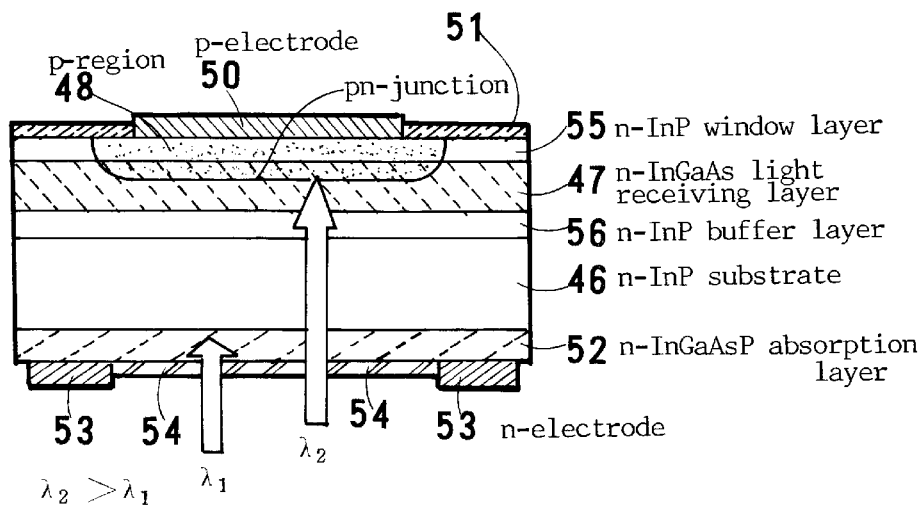
FIG. 10 is a more detailed vertical section of the photodiode, which was once proposed by the Inventors, for detecting only 1.55 μm light by annihilating 1.3 μm light.
Figure 11:
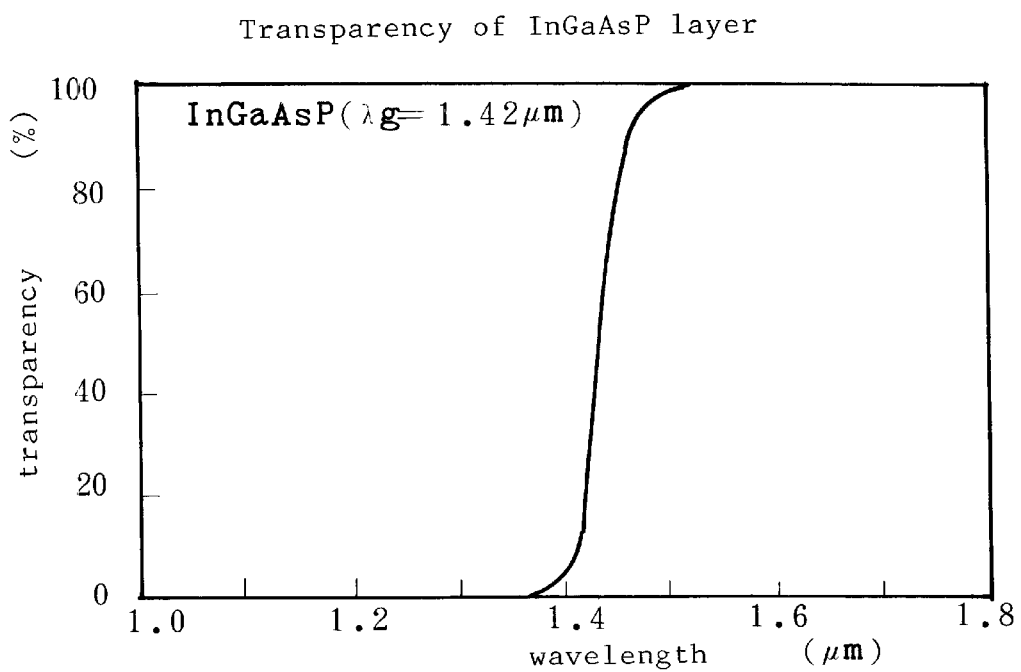
FIG. 11 is a graph of transparency rate (%) of InGaAsP ($\lambda$g=1.42 μm) as a function of wavelength.

The steps of making the PD of Embodiment 2 are explained. An epitaxial wafer is obtained by growing epitaxially an $n^+$-InGaAsP absorption layer 58, an n-InGaAs light receiving layer 59 and an n-InP window layer 69 in series on an $n^+$-InP substrate 57. The epitaxial wafer has the absorption layer 58 for absorbing $\lambda_1$ between the substrate 57 and the light receiving layer 59. The structure of substrate/absorption layer/receiving layer is the feature of Invention A. Embodiment 2 includes the InP window layer 69 in addition to the fundamental structure of Invention A. The InP having a good crystal property stabilizes the passivation of the pn-junction and lowers the dark current. The window layer having a wide band gap gives the lower absorption edge (P) in the sensitivity graph of FIG. 8.

The $n^+$-InP substrate 57 has, e.g., a 200 $\mu$m thickness and an $n=3\times10^{18}$ $cm^{-3}$ carrier (electron) concentration. The absorption layer 58 is, e.g., a 5 $\mu$m thick $n^+$-InGaAsP layer with carrier concentration of $n=10^{18}$ $cm^{-3}$. The light receiving layer 59 is a 3 $\mu$m to 4 $\mu$m thick InGaAs layer with carrier concentration of $n=10^{15}$ $cm^{-3}$. The n-InP window layer 69 has a 2 $\mu$m thickness and carrier concentration of $n=2\times10^{15}$ $cm^{-3}$. A central $p^+$-region 60 is produced by diffusing Zn through a masking resist on the n-InP window layer 69. A central pn-junction 61 and a central depletion layer 62 are generated below the central $p^+$-region 60.

At the same time, a peripheral $p^+$-region 70 is produced by the same Zn-diffusion step in the window layer 69 and the light receiving layer 59 at the periphery of a chip. A peripheral pn-junction 71 is yielded beneath the peripheral $p^+$-region 70. The Inventors call the peripheral $p^+$-region "diffusion shield layer". The word "shield" does not mean the suppression of electron diffusion but means the shield of the central sensing region from the outer light going into the peripheral area. The word "diffusion" means that the peripheral p-region is made by the Zn-diffusion. The peripheral p-region 70 is not reversely biased unlike the central p-region 60. The peripheral p-region 70 has the pn-junction 71 and a depletion layer 72 below. Edges of the pn-junctions 61 and 71 appear on the surface between the p-regions 60 and 70. A SiN passivation film 64 covers and protects the edges of the pn-junctions 61 and 71. An annular n-electrode 65 having an aperture is deposited on the bottom of the n-InP substrate 57. An antireflection film 66 covers the bottom of the substrate 57 within the aperture.

The PD is a bottom surface incidence type. The receiving light $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light (leak; B) going into via the bottom aperture is fully absorbed by the n-InGaAsP absorbing layer 58. The leak light A (B) does not reach the central depletion layer 62. An obliquely incidence light $\lambda_1$ beam (C) is also absorbed by the n-InGaAsP absorbing layer 58. The side incidence stray light A $\lambda_1$ (D) which goes into the InGaAs receiving layer 59 without passing the absorption layer 58 cannot attain to the central depletion layer 62. The PD is also insensitive to the side stray light (D). The extinction of the stray (D) is caused from another reason. The side incidence stray (D) makes electron-hole pairs in the peripheral depletion layer 72. The holes cross the pn-junction 71 and go into the peripheral p-region 70. The holes die away in the peripheral p-region by recombining with electrons. Since the peripheral p-region 70 is not connected to the p-electrode, the recombination in the p-region 70 does not generate photocurrent. The side stray light (D) is annihilated by the peripheral diffusion shield layer 70. Embodiment 2 prevents the $\lambda_1$ light from entering the central depletion layer 62 by the cooperation of the diffusion shield layer 70 and the absorption layer 58.

[Embodiment 3 (Bottom Incidence Type; Diffusion Shield Layer+Reflection Film)]

Figure 14:
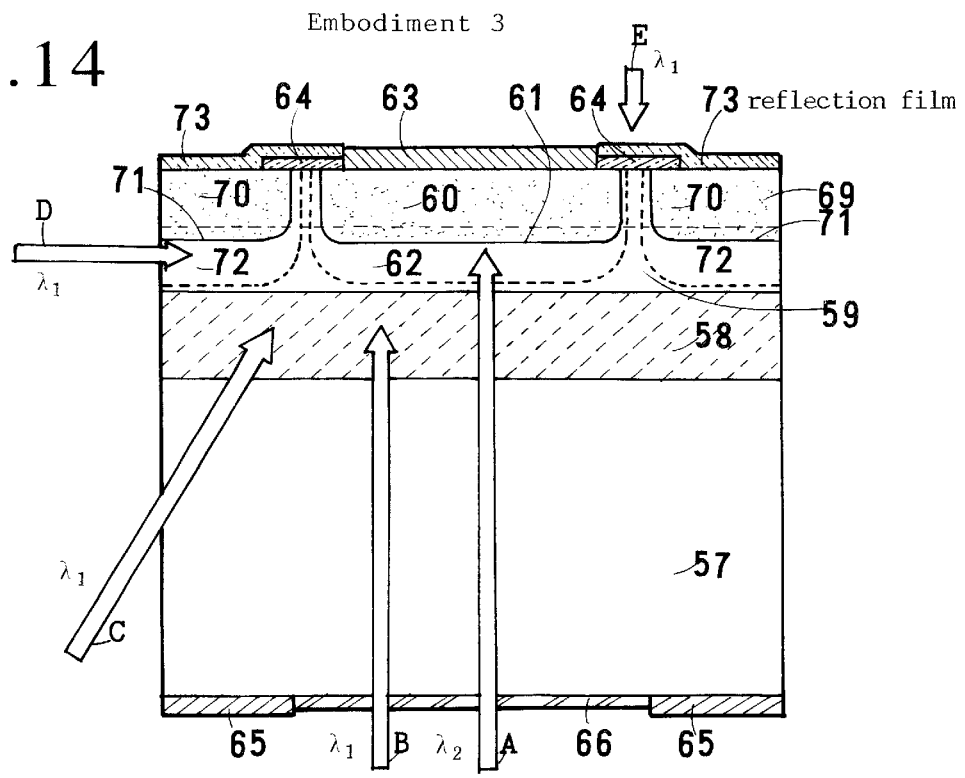
FIG. 14 is a section of Embodiment 3 of the present invention of a bottom incidence type PD having a peripheral diffusion shield layer and a reflection film.

FIG. 14 shows a more sophisticated embodiment of the bottom incidence type having the diffusion shield. The embodiment further has a reflection film for preventing the top incidence light $\lambda_1$ from invading into the PD. An epitaxial wafer is prepared by piling an n$^+$-InGaAsP absorption layer 58, an n-InGaAs light receiving layer 59 and an n-InP window layer 69 in series on an n$^+$-InP substrate 57 epitaxially. A central p$^+$-region 60 is made at the center of a chip in the window layer 69 and the light receiving layer 59 by diffusing Zn. A central pn-junction 61 and a central depletion layer 62 are formed below the central p-region 60.

The same Zn-diffusion makes a peripheral p$^+$-region 70 at the periphery of a chip. A peripheral pn-junction 71 and a peripheral depletion layer 72 follow the peripheral p$^+$-region 70. A p-electrode 63 is deposited upon the central p$^+$-region 60. Like Embodiment 2, a SiN passivation film 64 covers and protects the edges of the pn-junctions 61 and 71. The exposed top surface of the chip and the passivation film 64 are further covered with a reflection film 73. The reflection film 73 can reflect $\lambda_1$ light entirely. The top of the PD is fully covered and protected either by the p-electrode 63 (metal; opaque) or the reflection film 73. Noise $\lambda_1$ light includes the bottom-incidence leak light $\lambda_1$ (B), the oblique-incidence stray light $\lambda_1$(C), the side-incidence stray light $\lambda_1$ (D) and the top-incidence stray light $\lambda_1$ (E). The former Embodiment 2 can prevent the $\lambda_1$ (B), $\lambda_1$ (C) and $\lambda_1$ (D) light by the absorption layer 58 and the diffusion shield 70. In addition, Embodiment 3 can also recoil the top-incidence light $\lambda_1$ (E) by the reflection film 73. Embodiment 3 can remove all the $\lambda g_2$, entering in any directions. The PD is insensitive to $\lambda_1$ light completely.

[Embodiment 4 (Bottom Incidence Type; Diffusion Shield Layer+Reflection Film; Buffer Layer)]

Figure 15:
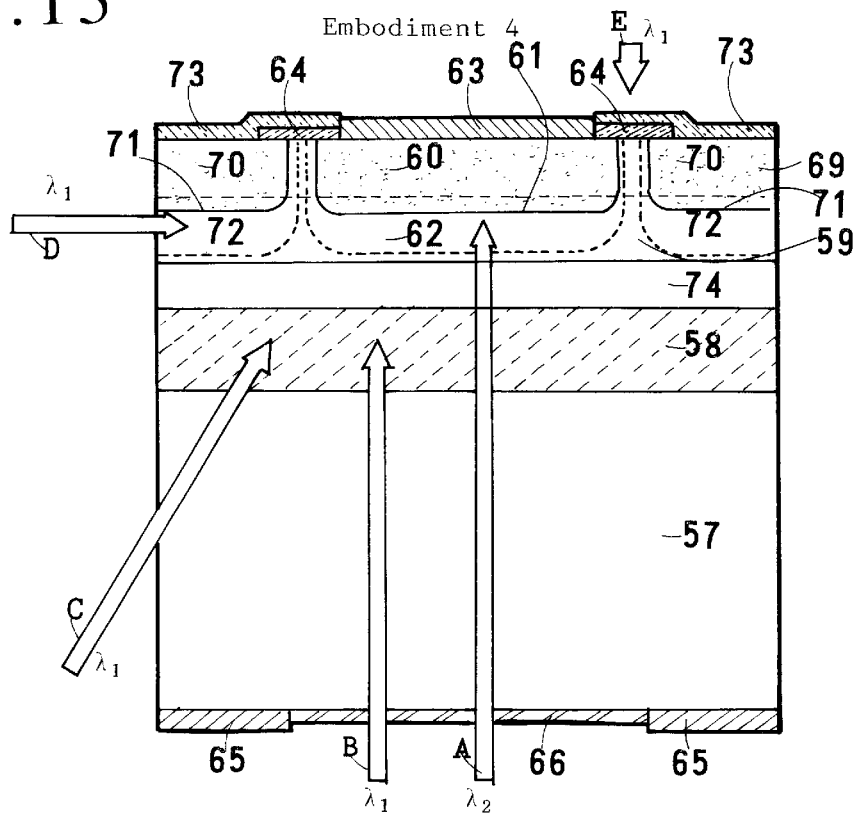
FIG. 15 is a section of Embodiment 4 of the present invention of a bottom incidence type PD having a peripheral diffusion shield layer, a reflection film and a buffer layer.

The highly doped InGaAsP absorption layer 58 sometimes disturbs the crystal structure. Insertion of a low-doped InP buffer layer improves the crystal property. The buffer layer prohibits the lattice defects or the impurities in the absorption layer 58 from having an influence upon the light receiving layer. FIG. 15 shows Embodiment 4 having a buffer layer between the absorption layer 58 and the light receiving layer 59.

An epitaxial wafer is prepared by piling an n$^+$-InGaAsP absorption layer 58, an n-InP buffer layer 74, an n-InGaAs light receiving layer 59 and an n-InP window layer 69 in turn on an n$^+$-InP substrate 57 epitaxially. The epitaxial wafer is different from previous Embodiment 3. Other points are similar to Embodiment 3. A central p$^+$-region 60 is made at the center of a chip in the window layer 69 and the light receiving layer 59 by diffusing Zn. A central pn-junction 61 and a central depletion layer 62 are formed below the central p-region 60. The same Zn-diffusion makes a peripheral p$^+$-region 70 at the periphery of a chip.

A peripheral pn-junction 71 and a peripheral depletion layer 72 appear below the peripheral p$^+$-region 70. A p-electrode 63 is deposited upon the central p$^+$-region 60. A passivation film 64 covers and protects the edges of the pn-junctions 61 and 71. The exposed top surface of the chip and the passivation film 64 are further covered with a reflection film 73. The reflection film 73 can reflect $\lambda_1$ light entirely. The top of the PD is fully covered and protected either by the p-electrode (metal; opaque) or the reflection film 73. These structure is the same as Embodiment 3. The newly introduced InP buffer layer 74 has a 2 $\mu$m to 4 $\mu$m thickness and n=$10^{15}$ cm$^{-3}$ carrier concentration. The addition of the buffer layer can also be applied to Embodiment 1 (FIG. 12) and Embodiment 2 (FIG. 13). Noise $\lambda_1$ (B), $\lambda_1$ (C), $\lambda_1$(D), and $\lambda_1$ (E) are all annihilated by the absorption layer 58, the diffusion shield 70 and reflection film 73 like Embodiment 3.

Figure 6:
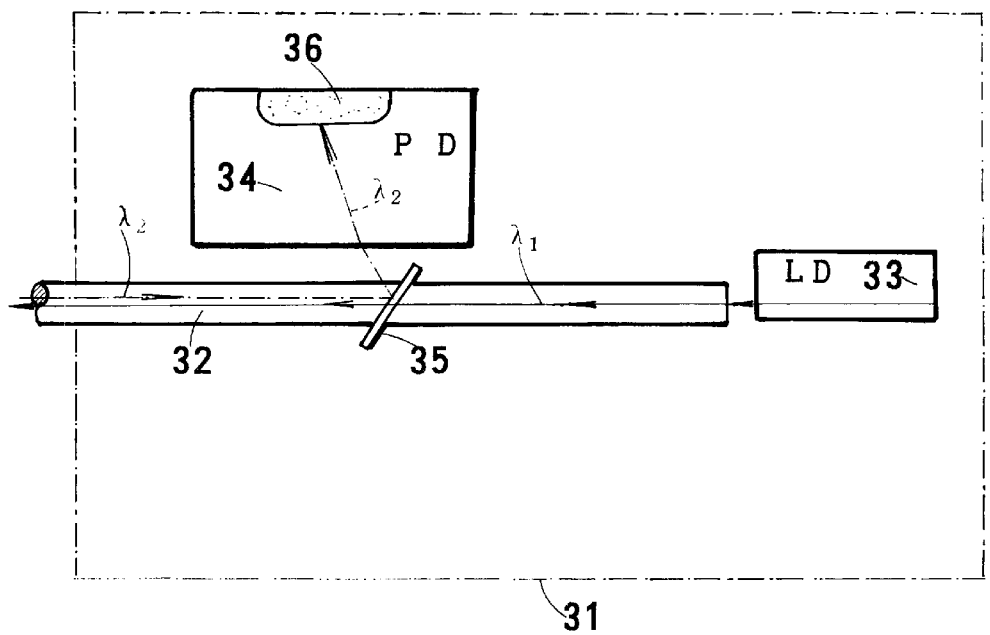
FIG. 6 is a schematic view of an unseparated path type LD/PD module having a PD and an LD on an extension of an optical fiber.
Figure 7:
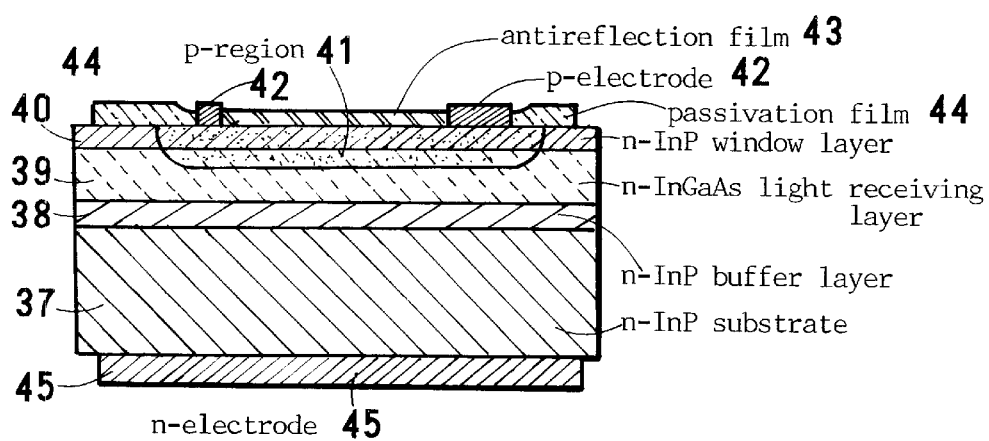
FIG. 7 is a vertical section of a prior art InGaAs-type photodiode (PD) chip.

Embodiment 4 of a 500 $\mu$m square and a 200 $\mu$m thickness is fabricated. The sensitivity is measured. Embodiment 4 shows high sensitivity of 1.0 A/W for 1.55 $\mu$m light from the bottom but extremely low sensitivity of less than 0.01 A/W for 1.3 $\mu$m light from the bottom. The PD is further examined by irradiating the top or the side by 1.3 $\mu$m light. The sensitivity is also less than 0.01 A/W for the top/side incidence 1.3 $\mu$m light. An LD/PD module as shown in FIG. 6 is made by adopting the PD of Embodiment 4 and adding a preamplifier. The PD exhibits an excellent sensitivity limit of −35 dBm for 1.55 $\mu$m without crosstalk with the LD.

[Embodiment 5 (Top Incidence Type; Diffusion Shield Layer+Reflection Film; Buffer Layer)]

Figure 16:
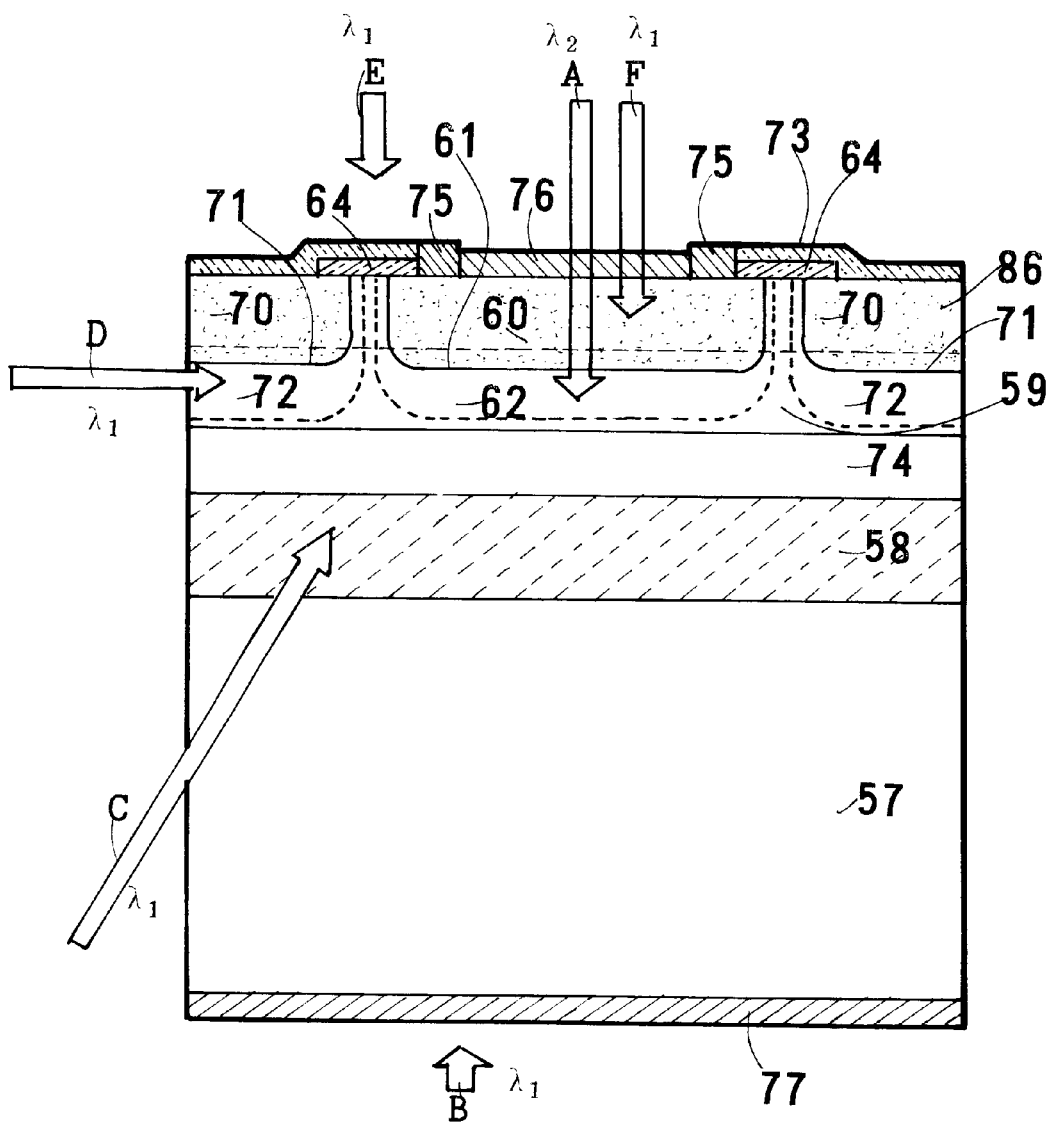
FIG. 16 is a section of Embodiment 5 of the present invention of a top incidence type PD having a peripheral diffusion shield layer, a reflection film and a buffer layer.

This invention can also be applied to a top incidence type PD. It is easy to convert the bottom incidence type PDs of FIG. 12, FIG. 13 and FIG. 14 to top incidence type PDs by changing the p-electrode to an annular one and the n-electrode to a holeless one. An embodiment of a top incidence type converted from FIG. 15 is explained here. FIG. 16 shows Embodiment 5 having a top aperture, a diffusion shield, a reflection film and a buffer layer.

An epitaxial wafer is prepared by piling an n$^+$-InGaAsP absorption layer 58, an n-InP buffer layer 74, an n-InGaAs light receiving layer 59 and an n-InGaAsP window layer 86 in turn on an n$^+$-InP substrate 57 epitaxially. The window layer is not InP but InGaAsP having a longer band gap wavelength $\lambda$g than InP. The InGaAsP window layer 86 is added in stead of an InP window layer for cutting $\lambda_1$ light ($\lambda$g(InGaAsP)>$\lambda_1$>$\lambda$g(InP)). Except the window layer, the epitaxial wafer is similar to Embodiment 4. Since this is a top incidence type, the window layer can play the role of wavelength selection.

A central p$^+$-region 60 is made at the center of a chip in the window layer 86 and the light receiving layer 59 by diffusing Zn. A central pn-junction 61 and a central depletion layer 62 are formed below the central p-region 60. The same Zn-diffusion makes a peripheral p$^+$-region 70 at the periphery of a chip at the same time. A peripheral pn-junction 71 and a peripheral depletion layer 72 appear below the peripheral p$^+$-region 70.

An annular p-electrode 75 with an aperture is deposited upon the central p$^+$-region 60. The central aperture is an opening for introducing signal light $\lambda_2$ entering the central p$^+$-region 60 via the top. An antireflection film 76 is deposited on the central p-region 60 within the central aperture for preventing $\lambda_2$ light from being reflected. A SiN passivation film 64 covers and protects the edges of the pn-junctions 61 and 71. A peripheral exposed top surface of the chip and the passivation film 64 are further covered with a reflection film 73. The reflection film 73 can reflect $\lambda_1$ light entirely. The bottom of the n$^+$-InP substrate 57 is fully covered with a holeless n-electrode 77. The window layer is made not of InP but of InGaAsP. Top incidence $\lambda_1$ light (F) is eliminated by the InGaAsP window layer 86.

The bottom stray light $\lambda_1$ (B) is recoiled by the holeless metal n-electrode 77. The oblique incidence stray light $\lambda_1$ (C) is fully absorbed by the InGaAsP absorption layer 58. The side stray light $\lambda_1$ (D) is removed by the peripheral diffusion shield layer 70. The peripheral top incidence light $\lambda_1$ (E) is recoiled by the reflection film 73. The central top incidence leak light $\lambda_1$ (F) is attenuated by the antireflection film 76. The antireflection film 76 comprises a pile of two kinds of dielectric thin films with different dielectric constants and different thicknesses. The antireflection film 76 is designed for preventing the reflection only to vertically incident light of a definite wavelength. The film reflects other wavelengths. Oblique incidence light is reflected by the film even if the light has the definite wavelength. The refractive index and the thickness of the film can be selected arbitrarily, the film allows vertical incidence light $\lambda_2$ to pass through the film and vertical incidence light $\lambda_1$ to be reflected. The central top leak (F) is, however, removed mainly by the InGaAsP window layer 86 ($\lambda$g(InGaAsP) >$\lambda_1$). In the case of the top incidence type, a WDM is placed above the PD. The top leak light $\lambda_1$ (F) is suppressed by the WDM, the antireflection film 76 and the InGaAsP window layer 86.

[Embodiment 6 (Waveguide Type; Buffer Layer)]

Figure 17:
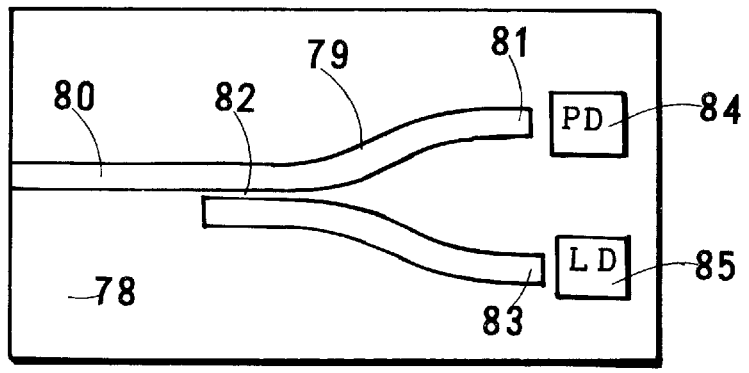
FIG. 17 is a plan view of an LD/PD module having an LD and a PD at ends of paths of a waveguide type WDM.

The embodiments explained hitherto relate to application of Invention A to the bottom incidence type PD and the top incidence type PD. The present invention can be also applied to a side incidence waveguide type PD. FIG. 17 shows the waveguide type LD/PD module for explaining the case requiring the waveguide type PD.

A branched waveguide 79 is produced on a substrate 78. The branched waveguide 79 comprises a common path 80, branched paths 81 and 83 and a connection part 82. The connection part 82 has parallel lines whose distance and length are exactly determined for obtaining the wavelength selectivity. The connection part 82 allots $\lambda_2$ to the first branched path 81 and $\lambda_1$ to the second branched path 83. The common path 80 admits both $\lambda_2$ and $\lambda_1$ to travel. An external optical fiber (not shown) is coupled to a left end of the common path 80.

A PD 84 is positioned before an end of the branched path 81 on the substrate. An LD 85 is positioned in front of an end of the branched path 83 on the substrate 78. The LD 85 produces transmission signal $\lambda_1$ light. The $\lambda_1$ light passes the waveguide 83, the connection part 82, the common path 80, and goes into the fiber. On the contrary, the receiving signal $\lambda_2$ light propagates in the fiber, enters the waveguide path 80, passes the part 82 and the branched path 81 and arrives finally at the PD 84. The waveguide type PD 84 is a special photodiode having a side inlet which enables the PD to receive directly the horizontally spreading $\lambda_2$ light.

Figure 18:
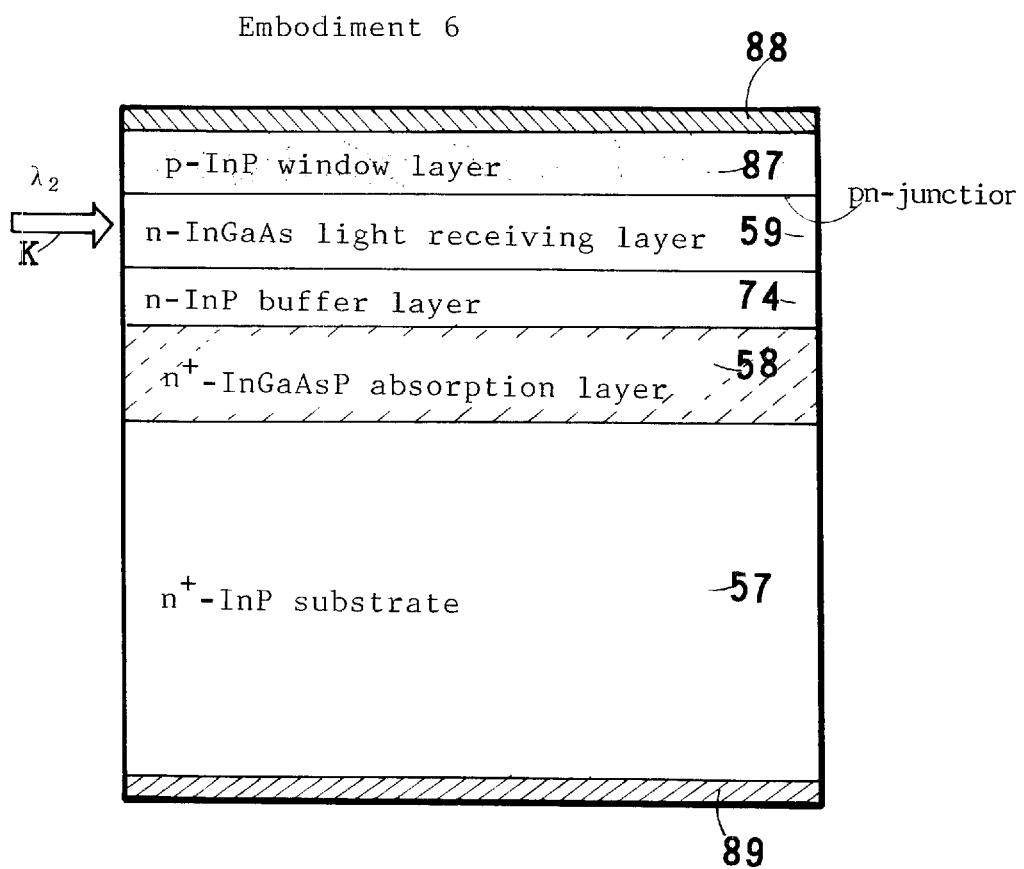
FIG. 18 is a section of Embodiment 6 of the present invention of a waveguide type PD.

FIG. 18 shows Embodiment 6 applied to the waveguide type PD. Unlike the former PDs, the p-region is not made by Zn diffusion, because the object light goes into the PD via a side. A p-region is epitaxially grown in an epitaxial wafer from the beginning. The epitaxial wafer is produced by piling in turn an n$^+$-InGaAsP absorption layer 58, an n-InP buffer layer 74, an n-InGaAs light receiving layer 59, and a p-InP window layer 87 epitaxially on an n$^+$-InP substrate 57. It should be noted that the top layer is not n-InP but p-InP. The interface between the n-InGaAs light receiving layer 59 and the p-InP window layer 87 is a pn-junction. The pn-junction is a wide horizontal plane unlike the former embodiments. There is no pn-junction edge appearing on the top surface, because the pn-junction is made not by diffusion but by epitaxy. Signal $\lambda_2$ light goes into the PD neither via the bottom nor via the top. The signal $\lambda_2$ (K) enters via the side into the n-InGaAs light receiving layer 59 for making pairs of electrons and holes which raise photocurrent.

Whole of the top is covered with a metal (opaque) p-electrode 88. The bottom of the substrate 57 is covered entirely with an opaque metal n-electrode 89. The PD has the n$^+$-InGaAsP absorption layer 58 beneath the buffer layer 74 and above the substrate 57. The sensing layer (n-InGaAs receiving layer 59) is protected by the n$^+$-InGaAs P absorption layer 58 from $\lambda_1$. Since the top and the bottom are fully covered with metallic electrodes 88 and 89, there is neither top-incidence stray light $\lambda_1$ nor bottom-incidence stray light $\lambda_1$ in the PD. The absorption layer 58 eliminates oblique incidence stray light $\lambda_1$.

The LD/PD module has the path 81 for the PD 84 which is separated from the path 83 for the LD 85. In addition to the separation of the paths, the PD itself has a special structure favorable for rejecting the LD stray $\lambda_1$ light. This is the best example for reducing the optical crosstalk.

[Embodiment 7 (Side Incidence Type; Slanting Side, Diffusion Shield Layer+Reflection Film; Buffer Layer)]

Figure 19:
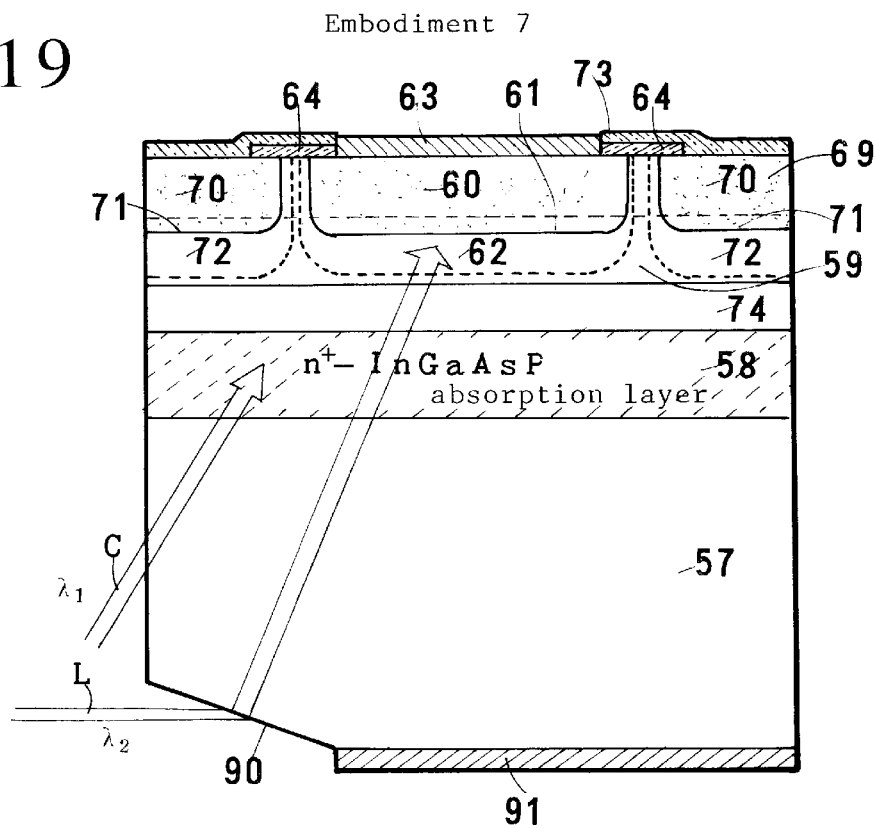
FIG. 19 is a section of Embodiment 7 of the present invention of a side incidence type PD having a slanting side plane.

The present invention can be also applied to another side incidence type PD. Previous Embodiment 6 is one of side incidence type PDs. In practice, it is not easy to couple the waveguide to the PD, because the n-InGaAs light receiving layer is too thin in Embodiment 6. Embodiment 7 has a slantingly cut side wall which reflects a horizontal beam in an upward oblique direction to the sensing region of the PD. FIG. 19 shows Embodiment 7 of the side incidence type PD.

An epitaxial wafer is prepared by piling an n$^+$-InGaAsP absorption layer 58, an n-InP buffer layer 74, an n-InGaAs light receiving layer 59 and an n-InP window layer 69 in turn on an n$^+$-InP substrate 57 epitaxially. The epitaxial wafer is similar to Embodiment 4 (FIG. 15). A central p$^+$-region 60 is made at the center of a chip in the window layer 69 and the light receiving layer 59 by diffusing Zn. A central pn-junction 61 and a central depletion layer 62 are formed below the central p-region 60. The same Zn-diffusion makes a peripheral p$^+$-region (diffusion shield layer) 70 at the periphery of a chip at the same time. A peripheral pn-junction 71 and a peripheral depletion layer 72 appear below the peripheral p$^+$-region 70.

A holeless p-electrode 63 is deposited upon the central p$^+$-region 60. The p-electrode 63 lacks an aperture, because light comes into the PD via a side. A SiN passivation film 64 covers and protects the edges of the pn-junctions 61 and 71. A peripheral exposed top surface of the chip and the passivation film 64 are further covered with a reflection film 73. The reflection film 73 can reflect $\lambda_1$ entirely. The bottom of the n$^+$-InP substrate 57 is fully covered with a holeless n-electrode 91. Wafer processes produce the basic PD structure. Then, the wafer is scribed along cleavage lines crosswise and lengthwise into plenty of chips. A bottom slanting plane 90 is made by grinding the edge of the bottom of the chip. The slanting plane 90 is an inlet of receiving light $\lambda_2$ (L). Horizontally travelling $\lambda_2$ (L) is refracted upward by the difference of refractive indices between the space and the InP. The upward deflected $\lambda_2$ passes the n$^+$-InGaAsP absorption layer 58 and arrives at the depletion layer 62 for making electron-hole pairs which produce photocurrent.

Stray $\lambda_1$ light shooting the top surface or the bottom surface is rejected by the metal electrodes 63 and 91. Oblique stray $\lambda_1$ (C) is removed by the n$^+$-InGaAsP absorption layer 58. Leak $\lambda_1$ light horizontally shooting at the slanting plane 90 is absorbed by the n$^+$-InGaAsP absorption layer 58.

[Embodiment 8 (Side Incidence Type; V-notch; Diffusion Shield Layer; Buffer Layer)]

Figure 20:
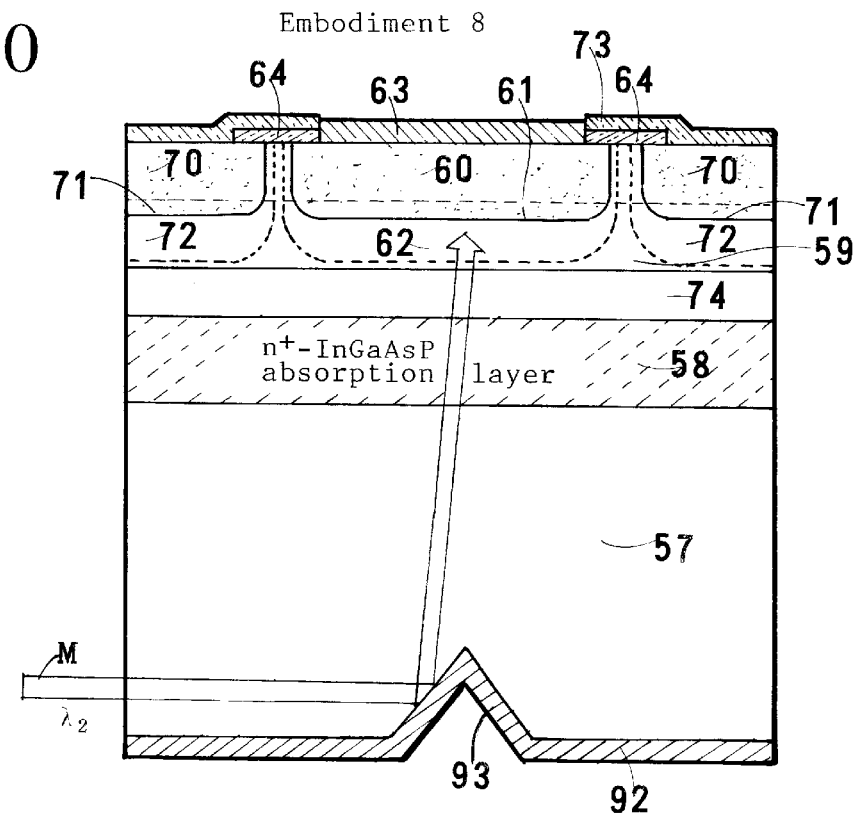
FIG. 20 is a section of Embodiment 8 of the present invention of a side incidence type PD having a notch on the bottom.

Side incidence type PDs have several versions. The first waveguide version and the second slating plane version have been already explained. A further side incidence type PD is a bottom V-notch version shown in FIG. 20. Horizontally-travelling signal $\lambda_2$ (M) comes into the PD via a side. The $\lambda_2$ (M) is reflected by a V-notch 93 upward to a central depletion layer 62 and a pn-junction 61. A bottom electrode 92, a top electrode 63, a top reflection film 73, an n$^+$-InGaAsP absorption layer 58 protect the PD from the stray and leak light $\lambda_1$.

[Embodiment 9 (Side Incidence Type; Mesa Etched; Epi-down)]

Figure 21:
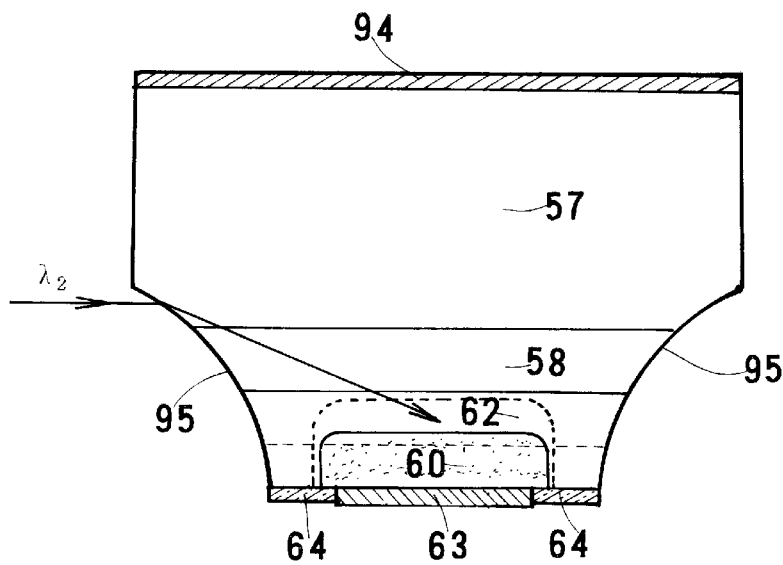
FIG. 21 is a section of Embodiment 9 of the present invention of a side incidence type PD having mesa etched top sides which is mounted upside down on a package.
Figure 22:
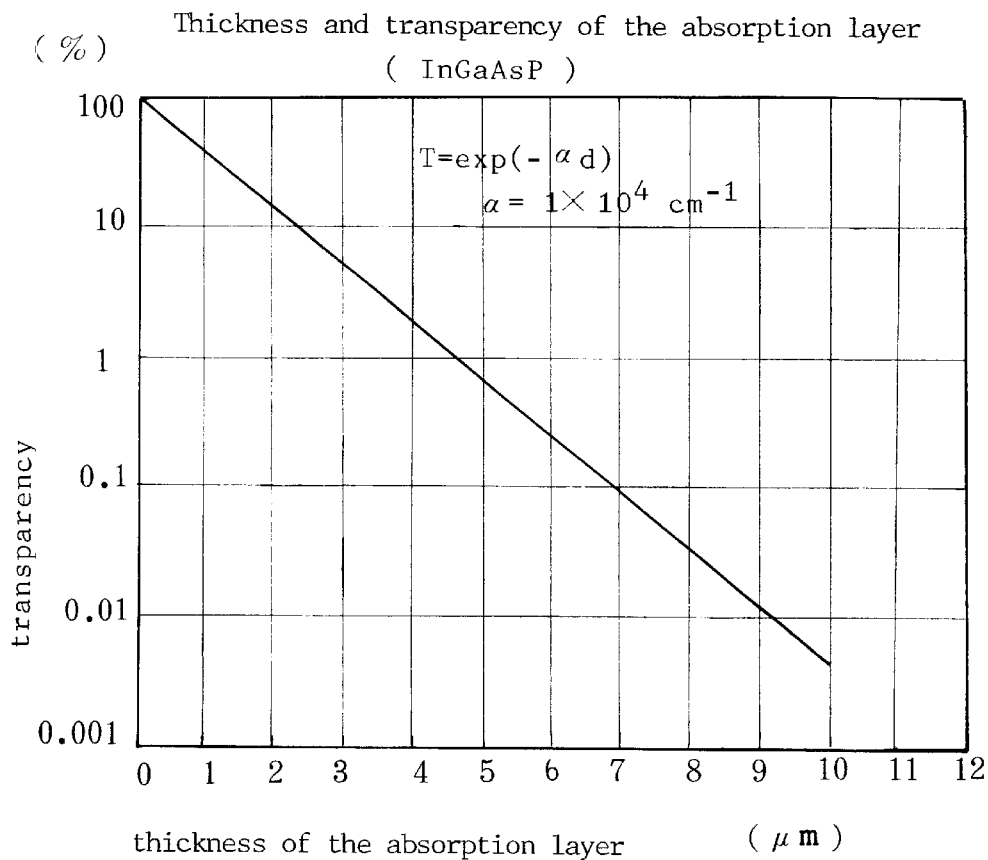
FIG. 22 is a graph of transparency of the InGaAsP absorption layer as a function of the thickness.

In addition to the waveguide version, the slanting plane version and the V-notch version, the side incidence type PD has a further version of a mesa-etched PD having a mesa shaped side for refracting horizontal light toward the sensing region. FIG. 21 shows Embodiment 9 of a mesa etched type PD. An epitaxial wafer comprises an n$^+$-InP substrate 57, an n$^+$-InGaAsP absorption layer 58, an n-InGaAs light receiving layer 59 and an n-InP window layer 69 from the bottom to the top. A central p-region 60 is made by Zn-diffusion. A pn-junction 61 and a central depletion layer 62 are made below the p-region 60. The p-region 60 is covered with a p-electrode 63. A SiN passivation film 64 covers and protects the edge of the pn-junction 61. The wafer is cut into plenty of chips. The top sides of a chip is etched like a mesa (plateau). Both sides have mesa curves 95. The PD is mounted upside down on a module (epi-down). Horizontally-propagating signal $\lambda_2$ light is refracted downward at the mesa curve 95 and is guided to the central depletion layer 62 for making photocurrent. $\lambda_1$ is excluded from the PD by an n-electrode 94, the p-electrode 63 and the absorption layer 58.

Invention B: Two Absorption Layers Above Substrate and Below Substrate [Embodiment 10 (Bottom Incidence Type; Fundamental Form)]

Figure 23:
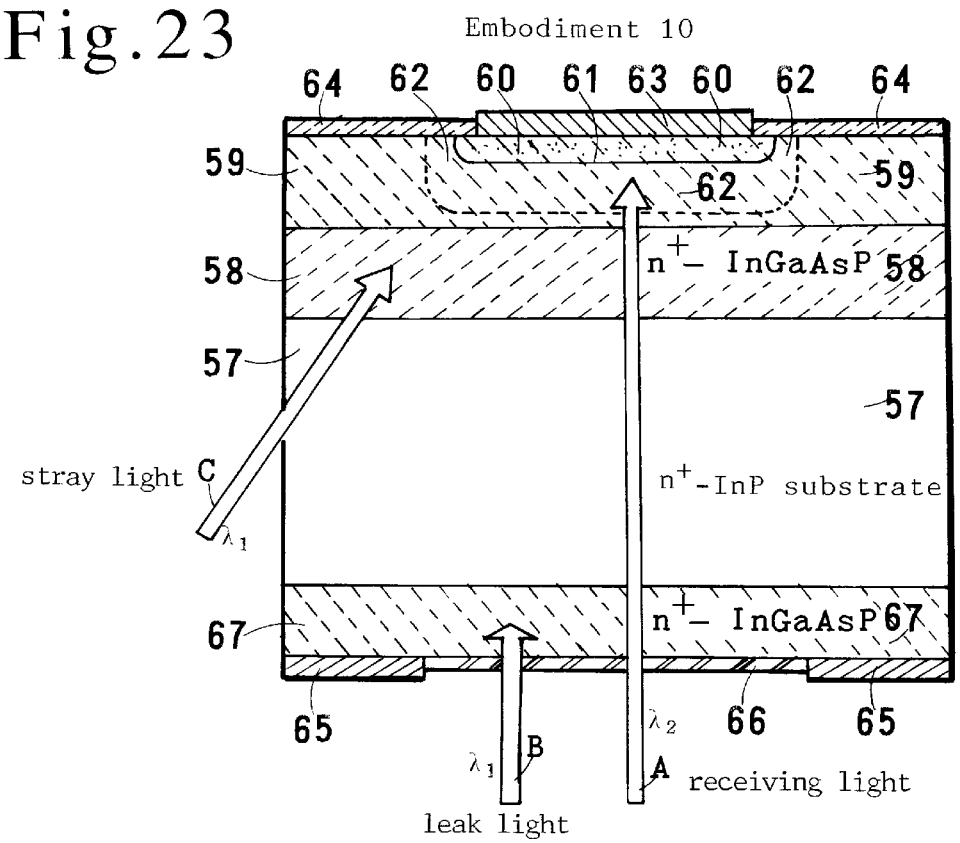
FIG. 23 is a section of Embodiment 10 of the present invention of a bottom incidence PD type having two absorption layers.

FIG. 23 denotes Embodiment 10 applied to a bottom incidence type PD. A starting material is an n-InP wafer (substrate) 57. A first n$^+$-InGaAsP absorption layer 67 is epitaxially grown on a (bottom) surface of the n$^+$-InP wafer 57. Then, a second n$^+$-InGaAsP absorption layer 58 and an n-InGaAs light receiving layer 59 are in turn epitaxially-grown on the other surface (top) of the n$^+$-InP substrate 57. The serial layer structure of [absorption layer/substrate/absorption layer/light receiving layer] is the conspicuous feature of Invention B.

The n$^+$-InP substrate 57 has, for example, a thickness of 200 $\mu$m and carrier (electron) concentration of n=3×10$^{18}$ cm$^{-3}$. Both the n$^+$-InGaAsP absorption layers have ,e.g., a 5 $\mu$m thickness and n=10$^{18}$ cm$^{-3}$ carrier density. The n-InGaAs light receiving layer 59 is, for example, 3 $\mu$m to 4 $\mu$m in thickness and n=10$^{15}$ cm$^{-3}$ in carrier density.

A p-region 60 is made by diffusing zinc (Zn) at the center of a chip on the light receiving layer 59 of the epitaxial wafer, as shown in FIG. 23. The carrier (hole) concentration p is not constant in the p-region 60 which has been formed by the impurity diffusion. The Zn diffusion makes a pn-junction 61 at which the p-impurity concentration is equal to the n-impurity concentration of the n-InGaAs layer (p=n; 10$^{15}$ cm$^{-3}$). Since the InGaAs light receiving region 59 has a small n-concentration, a thick depletion layer 62 appears beneath the pn-junction 61. A wide p-electrode 63 is formed on the p-region 60. The bottom incidence type allows the p-electrode 63 to cover almost all of the p-region 60. A passivation film 64 is deposited on the light receiving layer 59 around the p-electrode 63. The passivation film 64 is made, for example, of silicon nitride (SiN) for protecting the edge of the pn-junction 61. An annular n-electrode 65 is formed on the bottom surface of the n$^+$-InP substrate 57. Since the PD introduces light via the bottom surface, the n-electrode on the substrate should have an aperture. An antireflection film 66 is deposited on the substrate bottom within the aperture of the n-electrode.

Going into the PD via the bottom surface, signal $\lambda_2$ light (A) passes the first n$^+$-InGaAsP absorption layer 67, the n'-InP substrate 57 and the second n$^+$-InGaAsP absorption layer 58, and attains to the depletion layer 62. The signal $\lambda_2$ (A) makes pairs of electrons and holes in the depletion layer 62 which is reversely biased by an electric field. The reverse bias gives the depletion layer the sensitivity. The reverse bias brings electrons to the n-region downward and brings holes to the p-region 60 upward. The electron and the hole generate a photocurrent. The photocurrent flows from the n-electrode to the p-electrode in the PD. This is a normal operation of the PD for $\lambda_2$.

Imperfection of the WDM allows noise $\lambda_1$ (LD) light (B) to leak from the WDM to the bottom of the PD. Going into the PD via the bottom surface, the noise $\lambda_1$ (LD) leak light (B) extinguishes in the n$^+$-InGaAsP absorption layer 67, since $\lambda_1 < \lambda_g$(InGaAsP). Even if part of strong $\lambda_1$ leak light (B) survives the first n$^+$-InGaAsP absorption layer 67, the rest $\lambda_1$ light is absorbed by the second n$^+$-InGaAsP absorption layer 58. No bottom-incidence leak light $\lambda_1$ (B) reaches the above light receiving layer 59 or the depletion layer 62. The $\lambda_1$ (B) light cannot make photocurrent.

In addition to the bottom incidence light $\lambda_1$ (B), the second absorption layer 58 well absorbs obliquely incidence light $\lambda_1$ (C) which enters the PD via the side of the substrate 57. The oblique $\lambda_1$ (C) cannot make photocurrent. The PD of Invention B is insensitive both to the stray light $\lambda_1$ (C) and the leak light $\lambda_1$ (B). The leak light (B) is doubly eliminated by the first absorption layer 67 and the second absorption layer 58.

FIG. 23 shows a fundamental structure of the PD of Invention B. The fundamental PD of FIG. 23 reveals the function of suppressing the crosstalk of course. However, some improvements should be made on the fundamental PD in practice. For example, the PD is improved by adding an n-InP window layer on the n-InGaAs light receiving layer 59. The crystallographical property is enhanced by inserting an InP buffer layer between the substrate 57 and the InGaAs absorption layer 58.

[Embodiment 11 (Bottom Incidence Type; Diffusion Shield Layer)]

Figure 24:
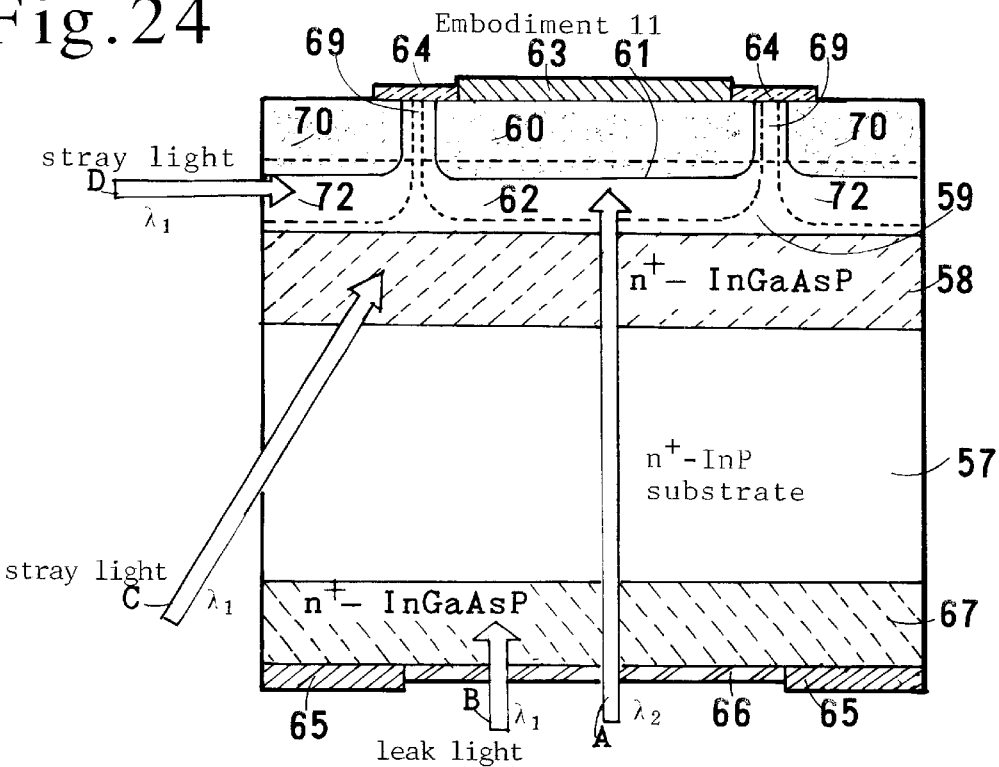
FIG. 24 is a section of Embodiment 11 of the present invention of a bottom incidence type PD having two absorption layers and a peripheral diffusion shield layers.

FIG. 24 shows Embodiment 11 which has a p-type diffusion shield layer around the p-electrode or the central p-region like Embodiment 2. The peripheral p-type diffusion shield layer is a similar p-region to the central p-region. The peripheral p-region is produced by the same step of making the central p-region.

An epitaxial wafer is prepared by growing epitaxially a first n$^+$-InGaAsP absorption layer 67 on a surface of an n+-InP substrate 57 and growing epitaxially a second n+-InGaAsP absorption layer 58, an n-InGaAs light receiving layer 59 and an n-InP window layer 69 in series on the other surface of the n+-InP substrate 57. The epitaxial wafer has two absorption layers 58 and 67 on both surfaces of the substrate 57. The structure of absorption layer/substrate/absorption layer/receiving layer is the feature of Invention B. The absorption layers 58, 67 play a role of filter layers. The top absorption layer (filter layer) 58 is produced on the top surface of the substrate 57, and the bottom absorption layer (filter layer) 67 is made on the bottom surface of the substrate 57. Embodiment 11 includes the InP window layer 69 in addition to the fundamental structure of Invention B. The InP having a good crystal property stabilizes the passivation of the pn-junction and lowers the dark current. The InP window layer 69 having a wide band gap gives the lower absorption edge (P) in the sensitivity graph of FIG. 8. The InP window layer 69 has the three advantages.

The n+-InP substrate 57 has, e.g., a 200 μm thickness and n=3×10$^{18}$ cm$^{-3}$ carrier (electron) concentration. The first and second n+-InGaAsP absorption layers 67 and 58 are, e.g., a 5 μm thick layer with carrier concentration of n=10$^{18}$ cm$^{-3}$. The sum of the thicknesses of the two layers 67 and 58 is 10 μm. The light receiving layer 59 is a 3 μm to 4 μm thick InGaAs layer with carrier concentration of n=10$^{15}$ cm$^{-3}$. The n-InP window layer 69 has, e.g., a 2 μm thickness and carrier concentration of n=2×10$^{15}$ cm$^{-3}$. A central p+-region 60 is produced by diffusing Zn through a masking resist on the n-InP window layer 69. A central pn-junction 61 and a central depletion layer 62 are generated below the central p+-region 60.

At the same time, a peripheral p+-region 70 is produced by the same Zn-diffusion step in the window layer 69 and the light receiving layer 59 at the periphery of a chip. A peripheral pn-junction 71 and a peripheral depletion layer 72 are yielded beneath the peripheral p+-region 70 (diffusion shield layer). A SiN passivation film 64 covers and protects the edges of the pn-junctions 61 and 71. An annular n-electrode 65 having an aperture is deposited on the bottom of the n+-InGaAsP absorption layer 67. An antireflection film 66 covers the bottom of the absorption layer 67 within the aperture.

The PD is a bottom surface incidence type. The receiving light $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light $\lambda_1$ (leak; B) going into via the bottom aperture is absorbed by the first n+-InGaAsP absorbing layer 67 and twice absorbed by the second n+-InGaAsP absorbing layer 58. Owing to the double absorption, the leak $\lambda_1$ (B) does not reach the central depletion layer 62. An obliquely incidence $\lambda_1$ beam (C) is also absorbed by the n-InGaAsP absorbing layer 58. The side incidence stray light $\lambda_1$ (D) which is eliminated by the diffusion shield layer 70 cannot attain to the central depletion layer. The PD is insensitive to the $\lambda_1$ light (B), (C) and (D).

[Embodiment 12 (Bottom Incidence Type; Diffusion Shield Layer+Reflection Film)]

Figure 25:
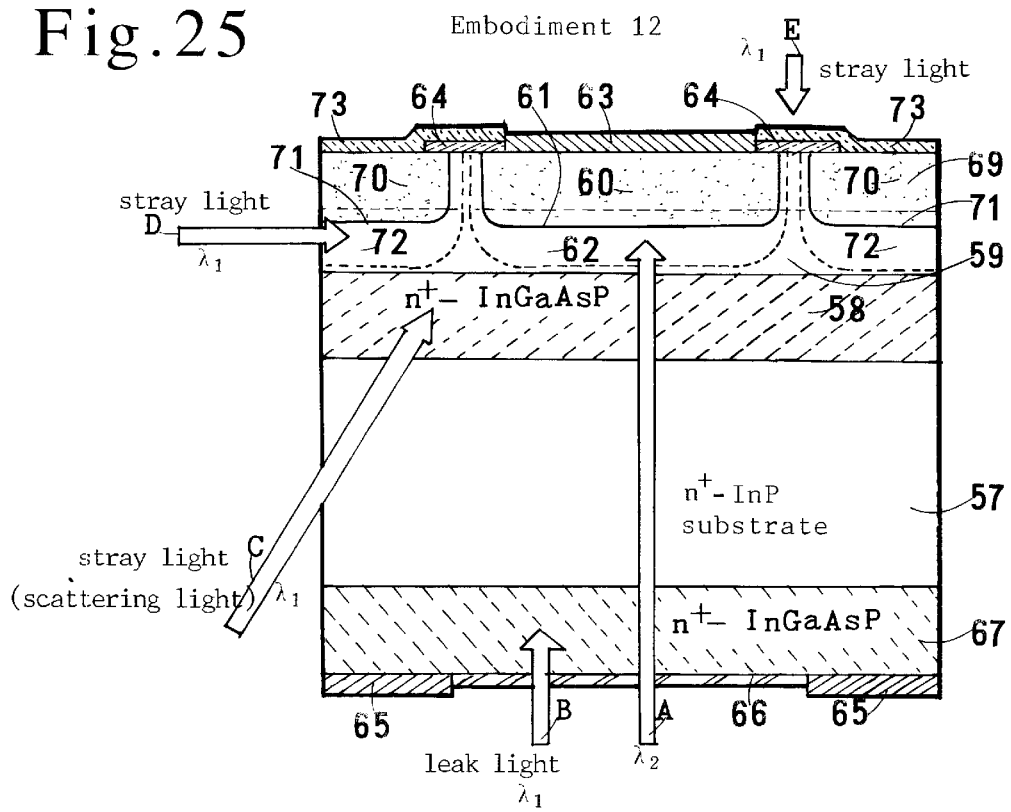
FIG. 25 is a section of Embodiment 12 of the present invention of a bottom incidence PD type having two absorption layers, a peripheral diffusion shield layer and a reflection film.

FIG. 25 shows a more sophisticated embodiment of the bottom incidence type having the diffusion shield. The embodiment further has a reflection film for preventing the top incidence light $\lambda_1$ from invading into the PD. An epitaxial wafer is prepared by piling an n+-InGaAsP absorption layer 67 on a surface of an n+-InP substrate 57 and piling epitaxially an n+-InGaAsP absorption layer 58, an n-InGaAs light receiving layer 59 and an n-InP window layer 69 in series on the other surface of the n+-InP substrate 57. A central p+-region 60 is made at the center of a chip in the window layer 69 and the light receiving layer 59 by diffusing Zn. A central pn-junction 61 and a central depletion layer 62 are formed below the central p-region 60.

The same Zn-diffusion makes a peripheral p+-region 70 at the periphery of a chip. A peripheral pn-junction 71 and a peripheral depletion layer 72 follow the peripheral p+-region 70. A p-electrode 63 is deposited upon the central p+-region 60. A SiN passivation film 64 covers and protects the edges of the pn-junctions 61 and 71. The exposed top surface of the chip and the passivation film 64 are further covered with a reflection film 73. The reflection film 73 can reflect $\lambda_1$ entirely. The top of the PD is fully covered and protected either by the p-electrode 63 (metal; opaque) or the reflection film 73. Noise $\lambda_1$ light includes the bottom-incidence leak light $\lambda_1$ (B), the oblique-incidence stray light $\lambda_1$ (C), the side-incidence stray light $\lambda_1$ (D) and the top-incidence stray light $\lambda_1$ (E). The former Embodiment 11 can prevent the $\lambda_1$ (B), $\lambda_1$ (C) and $\lambda_1$ (D) light by the absorption layer 58 and the diffusion shield 70. In addition, Embodiment 12 can also recoil the top-incidence stray light $\lambda_1$ (E) by the reflection film 73. Embodiment 12 can remove all the $\lambda_1$ light entering in any directions. The PD is insensitive to $\lambda_1$ completely.

[Embodiment 13 (Bottom Incidence Type; Diffusion Shield Layer+Reflection Film; Buffer Layer)]

Figure 26:
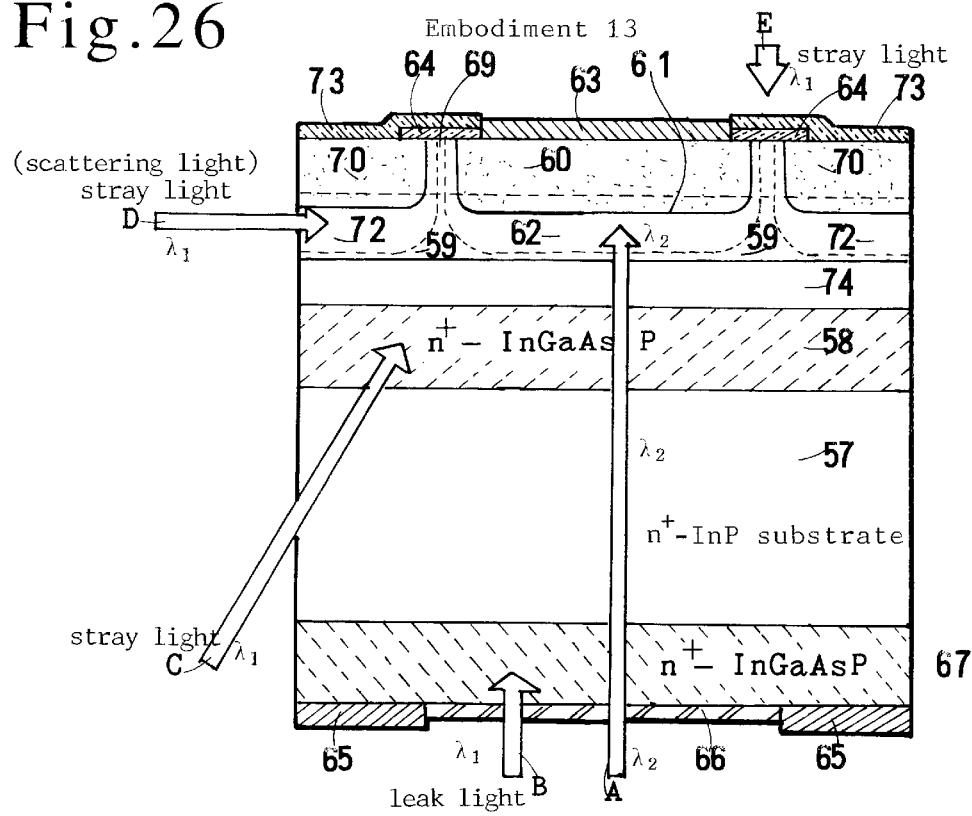
FIG. 26 is a section of Embodiment 13 of the present invention of a bottom incidence type PD having two absorption layers, a peripheral diffusion shield layer, a reflection film and a buffer layer.

The highly doped InGaAsP absorption layer 58 sometimes disturbs the crystal structure. Insertion of a low-doped InP buffer layer improves the crystal property. The buffer layer prohibits the lattice defects or the impurities in the absorption layer 58 from having an influence upon the light receiving layer. FIG. 26 shows Embodiment 13 having a buffer layer 74 between the absorption layer 58 and the light receiving layer 59.

An epitaxial wafer is prepared by piling a first n+-InGaAsP absorption layer 67 on a surface of an n+-InP substrate 57 epitaxially and piling a second n+-InGaAsP absorption layer 58, an n-InP buffer layer 74, an n-InGaAs light receiving layer 59 and an n-InP window layer 69 in turn on the other surface of the n+-InP substrate 57 epitaxially.

A central p+-region 60 is made at the center of a chip in the window layer 69 and the light receiving layer 59 by diffusing Zn. A central pn-junction 61 and a central depletion layer 62 are formed below the central p-region 60. The same Zn-diffusion makes a peripheral p+-region 70 at the periphery of a chip. A peripheral pn-junction 71 and a peripheral depletion layer 72 appear below the peripheral p+-region 70.

A p-electrode 63 is deposited upon the central p+-region 60. A SiN passivation film 64 covers and protects the edges of the pn-junctions 61 and 71. The exposed top surface of the chip and the passivation film 64 are further covered with a reflection film 73. The InP buffer layer 74 has a 2 μm to 4 μm thickness and n=10$^{15}$ cm$^{-3}$ carrier concentration. The addition of the buffer layer 74 can also be applied to Embodiments 10 (FIG. 23), Embodiments 11 (FIG. 24) and Embodiment 12 (FIG. 25). Noise $\lambda_1$ (B), $\lambda_1$ (C), $\lambda_1$ (D), and $\lambda_1$ (E) light are all annihilated by the absorption layer 58, the absorption layer 67, the diffusion shield 70 and reflection film 73.

Embodiment 13 of a 500 μm square and a 200 μm thickness is fabricated. The sensitivity is measured. Embodiment 13 shows high sensitivity of 1.0 A/W for 1.55 μm light coming from the bottom but extremely low sensitivity of less than 0.001 A/W for 1.3 μm light from the bottom. Double absorption layers 67 and 58 obtains the extinction ratio of 1/1000 (−30 dB) by completely annihilating the bottom incidence light $\lambda_1$ (B). The PD is further examined by irradiating the top or the side by 1.3 μm light. The sensitivity is also less than 0.01 A/W for the top/side incidence 1.3 μm light. An LD/PD module as shown in FIG. 6 is made by adopting the PD of Embodiment 13 and adding a preamplifier. The PD exhibits an excellent sensitivity limit of −35 dBm for 1.55 μm without crosstalk with the 1.3 μm light emitting LD of 1 mW (0 dBm).

[Embodiment 14 (SI-substrate; Bottom Incidence Type: Diffusion Shield Layer; Buffer Layer)]

All the embodiments described hitherto employ n-type InP substrate. However, this invention can be applied to an SI-INP substrate. SI means "semi-insulating". The semi-insulating InP has so high resistivity that electric current cannot flow in the SI-INP. The SI-InP is made by doping InP with e.g., Fe or Cr which forms deep impurity levels in the forbidden band. The deep levels trap carriers, which raises the resistivity. Although a Fe-doped SI-InP has the drawback of insulation, the SI-InP has a strong point of higher transparency than n-InP.

FIG. 27 shows Embodiment 14 of Invention A which is built upon an SI-InP substrate 100 doped with e.g., Fe. An epitaxial wafer is made by piling an n⁻-InGaAsP absorption layer 58, an n-InP buffer layer 74, an InGaAs light receiving layer 59 and an n-InP window layer 69 in turn on the SI-InP substrate 100 epitaxially. PDs are fabricated upon the epitaxial wafer by the wafer processes.

The SI-InP substrate 100 has, e.g., a 200 μm thickness with few carriers. The n⁺-InGaAsP absorption layer 58 is, e.g., a 5 μm thick layer with carrier concentration of n=$10^{18}$ cm⁻³. The light receiving layer 59 is a 3 μm to 4 μm thick InGaAs layer with carrier concentration of n=$10^{15}$ cm⁻³. The n-InP window layer 69 has, e.g., a 2 μm thickness and carrier concentration of n=$2\times10^{15}$ cm⁻³. A central p⁺-region 60 is produced in the InP window layer 69 and the n-InGaAs light receiving layer 59 at the center of a chip by diffusing Zn through a masking resist on the n-InP window layer 69. A central pn-junction 61 is generated below the central p⁺-region 60. A central depletion layer 62 accompanies the pn-junction 61 below.

At the same time, a peripheral p⁺-region 101 is produced by the same Zn-diffusion step in the window layer 69 and the light receiving layer 59 at the periphery of a chip. A peripheral pn-junction 102 and a peripheral depletion layer 110 are yielded beneath the peripheral p⁺-region 101 (diffusion shield layer). The diffusion shield layer 101 does not attain to the sides of the chip. The peripheral pn-junction 102 has a farther end at the top surface.

A holeless p-electrode 63 is fabricated upon the central p-region 60 of the window layer. A SiN passivation film 64 covers and protects the edges of the pn-junctions 61 and 102 on the window layer. An annular n-electrode 103 is deposited on the top of the peripheral p-region 101 and the n-type part of the n-InP window layer 69. The n-electrode 103 can be made of AuGeNi or TiAu. The p-electrode 63 and the n-electrode 103 are deposited on the same top surface concentrically. Since the SI-substrate 100 has no conductivity, both p-electrode and the n-electrode are formed upon the top surface of the PD. The bottom of the SI-InP substrate 100 has a metallized pattern 104 with an aperture. The metallized pattern 104 is not an n-electrode but a metal base for soldering the PD on a print circuit board. The central aperture of the bottom is covered with an antireflection film 66.

Since both electrodes are made on the top, the PD can electrically be separated from the circuit board, which raises the freedom of designing eclectic circuit. Irrespective to the circuit board pattern, the PD can be freely connected to a positive source or a negative source. The isolation of the electrodes enhances the resistance against the electric crosstalk.

The PD is a bottom surface incidence type. The receiving light $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light (leak; B) going into via the bottom aperture is absorbed by the n⁺-InGaAsP absorbing layer 58. An obliquely incidence $\lambda_1$ beam (C) is also absorbed by the n-InGaAsP absorbing layer 58. The side incidence stray light $\lambda_1$ (D) which is eliminated by the peripheral diffusion shield layer 101 cannot attain to the central depletion layer 62. The PD is insensitive to the $\lambda_1$ (B), (C) and (D) light.

[Embodiment 15 (SI-substrate; Bottom Incidence Type; Diffusion Shield Layer; Buffer Layer)]

FIG. 28 shows Embodiment 15 of Invention B which is built upon an SI-InP substrate 100 doped with e.g., Fe. An epitaxial wafer is made by piling an n⁺-InGaAsP first absorption layer 67 on one (bottom) surface of the SI-InP substrate 100 and piling an n⁺-InGaAsP second absorption layer 58, an n-InP buffer layer 74, an InGaAs light receiving layer 59 and an n-InP window layer 69 in turn on the other (top) surface of the SI-InP substrate 100 epitaxially. PDs are fabricated upon the epitaxial wafer by the wafer processes.

The SI-InP substrate 100 has, e.g., a 2001 μm thickness with few carriers. The n⁺-InGaAsP absorption layers 58 and 67 are, e.g., a 5 μm thick layer with carrier concentration of n=$10^{18}$ cm⁻³. The light receiving layer 59 is a 3 μm to 41 μm thick InGaAs layer with carrier concentration of n=$10^{15}$ cm⁻³. The n-InP window layer 69 has, e.g., a 2 μm thickness and carrier concentration n=$2\times10^{15}$ cm⁻³. A central p⁺-region 60 is produced in the n-InP window layer 69 and the n-InGaAs light receiving layer 59 at the center of a chip by diffusing Zn through a masking resist on the n-InP window layer 69. A central pn-junction 61 is generated below the central p⁺-region 60. A central depletion layer 62 accompanies the pn-junction 61 below.

At the same time, a peripheral p⁺-region 101 is produced by the same Zn-diffusion step in the window layer 69 and the light receiving layer 59 at the periphery of a chip. A peripheral pn-junction 102 and a peripheral depletion layer 110 are yielded beneath the peripheral p⁺-region 101 (diffusion shield layer). The diffusion shield layer 101 does not attain to the sides of the chip. The peripheral pn-junction 102 has a farther end at the top surface.

A holeless p-electrode 63 is fabricated upon the central p-region 60 of the window layer. A SiN passivation film 64 covers and protects the edges of the pn-junctions 61 and 102 on the window layer. An annular n-electrode 103 is deposited on the top of the peripheral p-region 101 and the n-type part of the n-InP window layer 69. The n-electrode 103 can be made of AuGeNi or TiAu. The p-electrode 63 and the n-electrode 103 are deposited on the same top surface concentrically. The bottom of the SI-InP substrate 100 has a metallized pattern 104 with an aperture. The metallized pattern 104 is not an n-electrode but a metal base for soldering the PD on a print circuit board. The central aperture of the bottom is covered with an antireflection film 66.

Since both electrodes are made on the top, the PD can electrically separated from the circuit board, which raises the freedom of designing electric circuit. Irrespective to the circuit board pattern, the PD can be freely connected to a positive source or a negative source. The isolation of the electrodes enhances the resistance against the electric crosstalk.

The PD is a bottom surface incidence type. The receiving light $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light (leak; B) going into via the bottom aperture is absorbed by the first n⁺-InGaAsP absorbing layer 67. An obliquely incidence $\lambda_1$ beam (C) is also absorbed by the second n-InGaAsP absorbing layer 58. The side incidence stray light $\lambda_1$ (D), which is eliminated by the peripheral diffusion shield layer 101, cannot attain to the central depletion layer 62. The PD is insensitive to the $\lambda_1$ (B), (C) and (D) light.

[Embodiment 16 (Bottom Incidence Type; Two Absorption Layers; Diffusion Shield Layer; Buffer Layer)]

FIG. 29 shows Embodiment 16 of Invention A containing two absorption layers above the top of an n⁺-InP substrate 57. An epitaxial wafer is obtained by growing epitaxially an n⁺-InGaAsP absorption layer 58, an InP buffer layer 74, another n⁺-InGaAsP absorption layer 105, an n-InGaAs light receiving layer 59 and an n-InP window layer 69 in series on the n⁺-InP substrate 57. The epitaxial wafer has two absorption layers 58 and 105 for absorbing $\lambda_1$ between the substrate 57 and the light receiving layer 59. Two absorption layers 58 and 105 are separated by the InP buffer layer 74. Heavily-doped InGaAsP degenerates the crystal property. Too thick InGaAsP layer disturbs the lattice regularity. The upper limit of the absorption layer is about 10 μm for maintaining the regular lattice structure. The InP buffer layer 74 restores the regularity of the lattice structure.

The n⁺-InP substrate 57 has, e.g., a 200 μm thickness and n=3×10¹⁸ cm⁻³ carrier (electron) concentration. The absorption layers 58 and 105 are, e.g., a 5 μm thick n⁺-InGaAsP layer with carrier concentration of n=10¹⁸ cm⁻³. The light receiving layer 59 is a 3 μm to 4 μm thick InGaAs layer with carrier concentration of n=10¹⁵ cm⁻³. The n-InP window layer 69 has a 2 μm thickness and carrier concentration of n=2×10¹⁵ cm⁻³. A central p⁺-region 60 is produced in the n-InP window layer 69 and the n-InGaAs light receiving layer 59 at the center of a chip by diffusing Zn through a masking resist on the InP window layer 69. A central pn-junction 61 is generated below the central p⁺-region 61.

At the same time, a peripheral p⁺-region 70 is produced by the same Zn-diffusion step in the window layer 69 and the light receiving layer 59 at the periphery of a chip. A peripheral pn-junction 71 is yielded beneath the peripheral p⁺-region 70 (diffusion shield layer). The peripheral p-region 70 has the pn-junction 71 which is followed by a depletion layer 72 below.

A p-electrode 63 is formed upon the central p-region 60. A SiN passivation film 64 covers and protects the edges of the pn-junctions 61 and 71. An annular n-electrode 65 having an aperture is deposited on the bottom of the n-InP substrate 57. An antireflection film 66 covers the bottom of the substrate 57 within the aperture.

The PD is a bottom surface incidence type. The receiving light $\lambda_2$ (A) reflected by a WDM (not shown) goes into the PD via the bottom aperture 66 and attains to the central depletion layer 62. The light $\lambda_2$ (A) makes electron-hole pairs in the depletion layer 62 which induce photocurrent. The noise transmission LD light (leak; B) going into via the bottom aperture is once absorbed by the n-InGaAsP absorbing layer 58. Even if some of $\lambda_1$ light (B) passes the absorption layer 58, the rest of the leak light $\lambda_1$ (B) is completely absorbed by the n-InGaAsP absorbing layer 105 again. The leak $\lambda_1$ light (B) does not reach the central depletion layer 62. An obliquely incidence $\lambda_1$ beam (C) is also absorbed by the n-InGaAsP absorbing layer 58. Another obliquely incidence $\lambda_1$ beam (G) is also absorbed by the upper n-InGaAsP absorbing layer 105. The side incidence stray $\lambda_1$ light (D) is prohibited by the diffusion shield layer 70. Embodiment 16 prevents the $\lambda_1$ (B), $\lambda_1$ (C), $\lambda_1$ (D) and $\lambda_1$ (G) light.

[EMBODIMENT 17 (Bottom Incidence Type; Three Absorption Layers; Diffusion Shield Layer; Buffer Layer Above Substrate)]

FIG. 30 shows Embodiment 17 of Invention B containing one absorption layer on the bottom and two absorption layers above the top of an n⁺-InP substrate 57. An epitaxial wafer is obtained by growing epitaxially an n⁺-InGaAsP absorption layer 67 on one surface of the n⁺-InP substrate 57, and piling epitaxially an n⁺-InGaAsP absorption layer 58, an InP buffer layer 74, another n⁺-InGaAsP absorption layer 105, an n-InGaAs light receiving layer 59 and an n-InP window layer 69 in series on the other surface of the n⁺-InP substrate 57. The epitaxial wafer has three absorption layers 67, 58 and 105 for absorbing $\lambda_1$ light. Two absorption layers 58 and 105 are separated by the InP buffer layer 74. The InP buffer layer 74 restores the regularity of the lattice structure.

The n⁺-InP substrate 57 has, e.g., a 200 μm thickness and n=3×10¹⁸ cm⁻³ carrier (electron) concentration. The absorption layers 67, 58 and 105 are, e.g., a 5 μm thick n⁺-InGaAsP layer with carrier concentration of n=10¹⁸ cm⁻³. The light receiving layer 59 is a 3 μm to 4 μm thick InGaAs layer with carrier concentration of n=10¹⁵ cm⁻³. The n-InP window layer 69 has a 2 μm thickness and carrier concentration of n=b 2×10¹⁵ cm⁺³. A central p⁺-region 60 is produced in the n-InP window layer 69 and the n-InGaAs light receiving layer 59 at the center of a chip by diffusing Zn through a masking resist on the n-InP window layer 69. A central pn-junction 61 is generated below the central p⁺-region 60.

At the same time, a peripheral p⁺-region 70 is produced by the same Zn-diffusion step in the window layer 69 and the light receiving layer 59 at the periphery of a chip. A peripheral pn-junction 71 is yielded beneath the peripheral p⁺-region 70 (diffusion shield layer). The peripheral p-region 70 has the pn-junction 71 which is followed by a depletion layer 72 below.

A p-electrode 63 is formed upon the central p-region 60. A SiN passivation film 64 covers and protects the edges of the pn-junctions 61 and 71. An annular n-electrode 65 having an aperture is deposited on the bottom of the n-InGaAsP absorption layer 67. An antireflection film 66 covers the bottom of the absorption layer 67 within the aperture.

The PD is a bottom surface incidence type. The receiving light $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light (leak; B) going into via the bottom aperture is absorbed by the n-InGaAsP absorbing layer 67. Even if some of $\lambda_1$ (B) light passes the absorption layer 67, the rest of the leak $\lambda_1$ (B) light is completely absorbed by the n⁺-InGaAsP absorbing layers 58 and 105. The leak light $\lambda_1$ (B) does not reach the central depletion layer 62. An obliquely incidence $\lambda_1$ beam (C) is also absorbed by the n⁺-InGaAsP absorbing layer 58. Another obliquely incidence $\lambda_1$ beam (G) is also absorbed by the upper n-InGaAsP absorbing layer 105. The side incidence stray $\lambda_1$ light (D) is prohibited by the diffusion shield layer 70. Embodiment 17 prevents the $\lambda_1$ (B), $\lambda_1$ (C), $\lambda_1$ (D) and $\lambda_1$ (G) light.

[Embodiment 18 (Bottom Incidence Type; Three Absorption Layers; Diffusion Shield Layer; Buffer Layer Below Substrate)]

Figure 31:
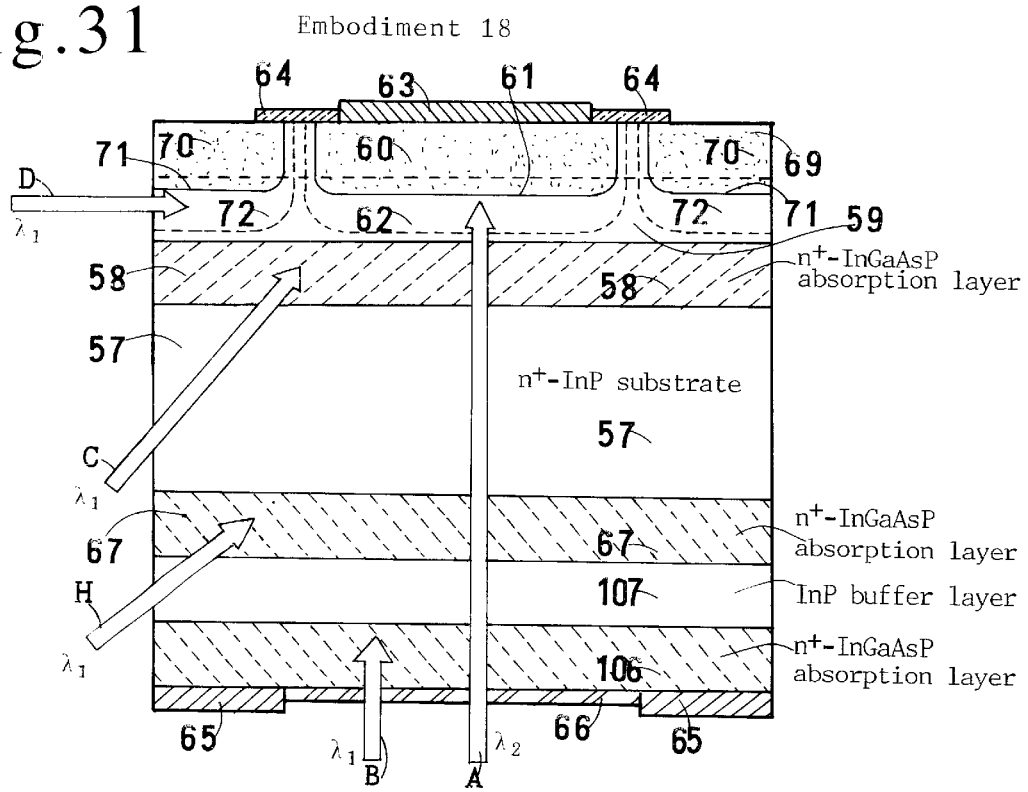
FIG. 31 is a section of Embodiment 18 of the present invention of a bottom incidence type having an $n^+$-InP substrate, one absorption layer above the substrate, two absorption layers below the substrate, a peripheral diffusion shield layer, an n-electrode with an aperture on a bottom surface of the absorption layer and a p-electrode formed on a top surface.

FIG. 31 shows Embodiment 18 of Invention B containing two absorption layers below the bottom and one absorption layer above the top of an n$^+$-InP substrate 57. An epitaxial wafer is obtained by growing epitaxially an n$^+$-InGaAsP absorption layer 67, an InP buffer layer 107 and another n$^+$-InGaAsP absorption layer 106 in turn on one surface of the n$^{+3}$-InP substrate 57, and piling epitaxially an n$^+$-InGaAsP absorption layer 58, an n-InGaAs light receiving layer 59 and an n$^{30}$-InP window layer 69 in series on the other surface of the n$^+$-InP substrate 57. The epitaxial wafer has three absorption layers 67, 58 and 106 for absorbing $\lambda_1$ light. Two absorption layers 67 and 106 are separated by the InP buffer layer 107. The InP buffer layer 107 restores the regularity of the lattice structure.

The n$^+$-InP substrate 57 has, e.g., a 200 μm thickness and n=×10$^{18}$ cm$^{-3}$ carrier (electron) concentration. The absorption layers 67, 58 and 106 are, e.g., a 5 μm thick n$^+$-InGaAsP layer with carrier concentration of n=2×10$^{15}$ cm$^{-3}$. The light receiving layer 59 is a 3 μm to 4 μm thick InGaAs layer with carrier concentration of n=10$^{15}$ cm$^{-3}$. The n-InP window layer 69 has a 2 μm thickness and carrier concentration of n=2×10$^{15}$ cm$^{-3}$. A central p$^+$-region 60 is produced in the n-InP window layer 69 and the n-InGaAs light receiving layer 59 at the center of a chip by diffusing Zn through a masking resist on the n-InP window layer 69. A central pn-junction 61 is generated below the central p$^+$-region 60.

At the same time, a peripheral p$^+$-region 70 is produced by the same Zn-diffusion step in the window layer 69 and the light receiving layer 59 at the periphery of a chip. A peripheral pn-junction 71 is yielded beneath the peripheral p-region 70 (diffusion shield layer). The peripheral p-region 70 has the pn-junction 71 which is followed by a depletion layer 72 below.

A p-electrode 63 is formed upon the central p-region 60. A SiN passivation film 64 covers and protects the edges of the pn-junctions 61 and 71. An annular n-electrode 65 having an aperture is deposited on the bottom of the n$^+$-InGaAsP absorption layer 106. An antireflection film 66 covers the bottom of the absorption layer 106 within the aperture.

The PD is a bottom surface incidence type. The receiving light $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light (leak; B) going into via the bottom aperture is absorbed by the n-InGaAsP absorbing layer 106. Even if some of $\lambda_1$ (B) light passes the absorption layer 106, the rest of the leak $\lambda_1$ (B) light is completely absorbed by the n$^+$-InGaAsP absorbing layers 67 and 58. The leak light $\lambda_1$ (B) does not reach the central depletion layer 62. An obliquely incidence $\lambda_1$ beam (C) is also absorbed by the n$^+$-InGaAsP absorbing layer 58. Another obliquely incidence $\lambda_1$ beam (H) is also absorbed by the n-InGaAsP absorbing layer 67. The side incidence stray $\lambda_1$ light (D) is prohibited by the diffusion shield layer 70. Embodiment 18 prevents the $\lambda_1$ (B), $\lambda_1$ (C), $\lambda_1$ (D) and $\lambda_1$ (H) light.

[Embodiment 19 (Bottom Incidence Type; Two Absorption Layers; Diffusion Shield Layer; Buffer Layer)]

Figure 32:
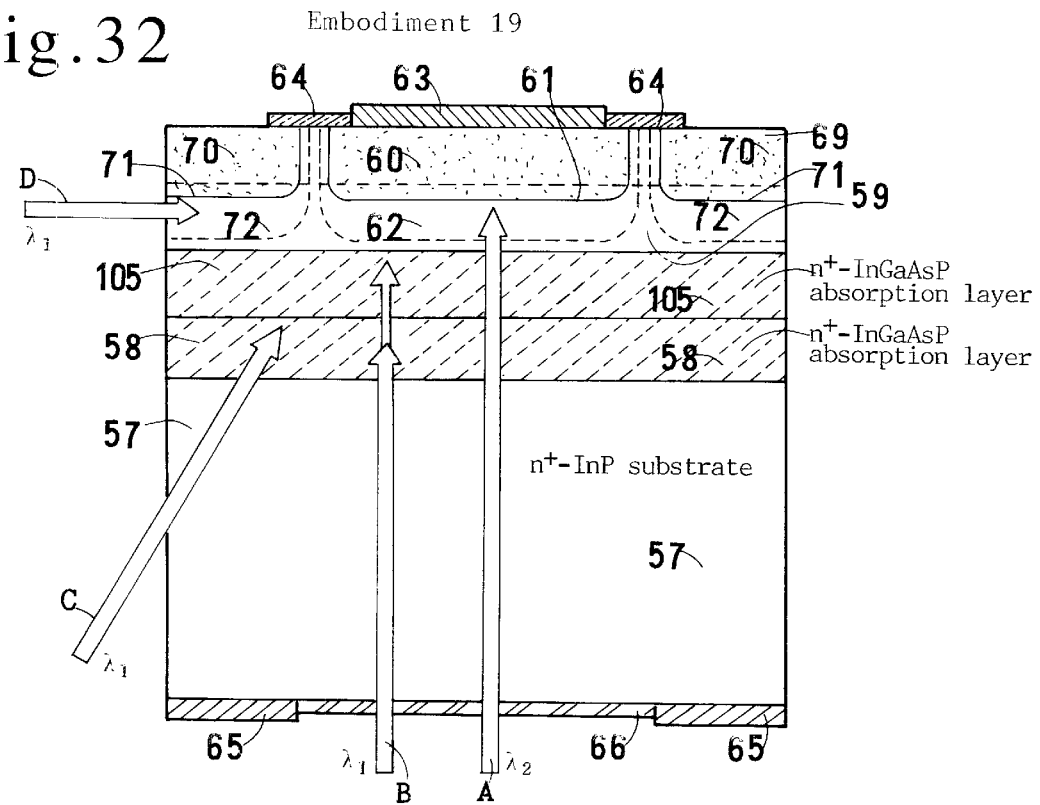
FIG. 32 is a section of Embodiment 19 of the present invention of a bottom incidence type having an $n^+$-InP substrate, two absorption layers adjacent together above the substrate, a peripheral diffusion shield layer, an n-electrode with an aperture on a bottom surface of the absorption layer and a p-electrode formed on a top surface.

FIG. 32 shows Embodiment 19 of Invention A containing two absorption layers above the top of an n$^+$-InP substrate 57. An epitaxial wafer is obtained by growing epitaxially an n$^+$-InGaAsP absorption layer 58, another n$^+$-InGaAsP absorption layer 105, an n-InGaAs light receiving layer 59 and an n-InP window layer 69 in series on the n$^+$-InP substrate 57. Some pause should be interposed between the step of growing the first absorption layer 58 and the step of growing the second absorption layer 105. The epitaxial wafer has two absorption layers 105 and 58 for absorbing, light. Two absorption layers 105 and 58 are not separated by an InP buffer layer. But the temporal pause of epitaxy improves the lattice regularity of the second absorption layer 105.

A central p-region 60 and the peripheral p-region 70 are formed by diffusing Zn through a mask. A p-electrode 63 is formed upon the central p-region 60. A SiN passivation film 64 covered the edges of the pn-junctions 61 and 71. An annular n-electrode 65 is deposited upon the bottom of the n$^+$-InP substrate 57. An antireflection film protects the central aperture of the bottom.

The receiving light ; $\lambda_2$ (A) reflected by a WDM (not shown) goes into the PD via the bottom aperture 66 and attains to the central depletion layer 62. The $\lambda_2$ (A) makes electron-hole pairs in the depletion layer 62 which induce photocurrent. The noise transmission LD light (leak; B) going into via the bottom aperture is absorbed by the n-InGaAsP absorbing layers 58 and 105. An obliquely incidence $\lambda_1$ beam (C) is also absorbed by the n-InGaAsP absorbing layer 58. The side incidence stray light $\lambda_1$ (D) is prohibited by the diffusion shield layer 70. Embodiment 18 prevents the $\lambda_1$ (B), $\lambda_1$ (C) and $\lambda_1$ (D) light.

What is claimed is:

1. A photodiode for sensing only one signal light having a wavelength denoted by $\lambda_2$ longer than a wavelength of noise denoted by $\lambda_1(\lambda_2>\lambda_1)$ in an optical communication system using light having wavelengths $\lambda_1$ and $\lambda_2$, comprising:

a substrate having a top surface and a bottom surface;

at least a first absorption layer made on the bottom surface of the substrate having a band gap wavelength $\lambda g$;

at least a second absorption layer made on the top surface of the substrate having a band gap wavelength $\lambda g$; and a light receiving layer being formed above the second absorption layer including a pn-junction, a p-region and an n-region, and having a band gap wavelength longer than the band gap wavelength $\lambda g$ of the absorption layers;

wherein having the band gap wavelength $\lambda g$ of the absorption layers is shorter than $\lambda_2$, but longer than $\lambda_1(\lambda_1<\lambda g<\lambda_2)$.

2. A photodiode as claimed in claim 1, wherein the two absorption layers and the light receiving layer are made on the substrate by epitaxial growth.

3. A photodiode as claimed in claim 2, wherein the signal wavelength $\lambda_2$ to be received ranges from a 1.5 μm band to a 1.6 μm band, the noise wavelength $\lambda_1$ to be eliminated ranges from a 1.2 μm band to a 1.3 μm band.

4. A photodiode as claimed in claim 3, wherein the substrate is an InP substrate, the absorption layers are InGaAsP ($\lambda g$=1.40 μm~1.46 μm) layers made on both surfaces of the substrate, the light receiving layer is an InGaAs layer.

5. A photodiode as claimed in claim 4, wherein an InP buffer layer is grown between the second InGaAsP absorption layer and the InGaAs light receiving layer.

6. A photodiode as claimed in claim 5, wherein an InP window layer is grown on the InGaAs light receiving layer, and a central pn-junction and a peripheral pn-junction are formed in the InP window layer and the InGaAs light receiving layer by diffusing an impurity and the InGaAs light receiving layer and the InP window layer have a central p-region, the central pn-junction, a diffusion shield layer (peripheral p-region) outside of the central pn-junction and the peripheral pn-junction.

7. A photodiode as claimed in claim 6, wherein an annular electrode is formed on the bottom surface of the substrate, and an opaque holeless top electrode is formed at a center part of a top surface above the light receiving layer.

8. A photodiode as claimed in claim 7, wherein a peripheral part of the top surface outside of the holeless top electrode is covered with a dielectric antireflection film which reflects noise $\lambda_1$ light.

9. A photodiode as claimed in claim 5, wherein the InGaAs light receiving layer has a central p-region, a central pn-junction, a diffusion shield layer (peripheral p-region) outside of the central pn-junction and a peripheral pn-junction which are made by diffusing an impurity.

* * * * *